(12) United States Patent
Kobayakawa

(10) Patent No.: US 7,238,549 B2
(45) Date of Patent: Jul. 3, 2007

(54) SURFACE-MOUNTING SEMICONDUCTOR DEVICE AND METHOD OF MAKING THE SAME

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 118 days.

(21) Appl. No.: 11/256,553

(22) Filed: Oct. 21, 2005

(65) Prior Publication Data

US 2006/0043613 A1    Mar. 2, 2006

Related U.S. Application Data

(62) Division of application No. 10/786,403, filed on Feb. 23, 2004, now Pat. No. 6,989,585, which is a division of application No. 10/044,231, filed on Jan. 11, 2002, now Pat. No. 6,734,536.

(30) Foreign Application Priority Data

| Jan. 12, 2001 | (JP) | ................................ 2001-4433 |
| Jan. 17, 2001 | (JP) | ................................ 2001-8948 |
| Jan. 25, 2001 | (JP) | ................................ 2001-17225 |

(51) Int. Cl.
    *H01L 21/00* (2006.01)
(52) U.S. Cl. .................. 438/111; 438/112; 438/123; 257/E23.031; 257/E23.042; 257/E23.043
(58) Field of Classification Search ............ 438/111, 438/112, 123, 124; 257/E23.031, E23.042, 257/E23.043
    See application file for complete search history.

(56) References Cited

U.S. PATENT DOCUMENTS

| 4,945,398 | A | 7/1990 | Kurita et al. |
| 6,303,985 | B1 * | 10/2001 | Larson et al. ............... 257/676 |
| 6,455,356 | B1 * | 9/2002 | Glenn et al. ................ 438/123 |
| 6,458,617 | B1 * | 10/2002 | Liao et al. .................... 438/51 |
| 6,646,339 | B1 * | 11/2003 | Ku et al. ..................... 257/708 |
| 6,664,621 | B2 | 12/2003 | Smith et al. |
| 6,812,552 | B2 | 11/2004 | Islam et al. |
| 6,858,879 | B2 | 2/2005 | Waitl et al. |
| 6,897,096 | B2 | 5/2005 | Cobbley et al. |
| 7,042,068 | B2 * | 5/2006 | Ahn et al. .................. 257/666 |
| 2002/0005575 | A1 * | 1/2002 | Park et al. .................. 257/686 |

\* cited by examiner

*Primary Examiner*—Trung Dang
(74) *Attorney, Agent, or Firm*—Hamre, Schumann, Mueller & Larson, P.C.

(57) ABSTRACT

A semiconductor device X1 comprises: a first conductor 110 including a first terminal surface 113a; a second conductor 120 placed by the first conductor 110 and including a second terminal surface 123a facing a same direction as does the first terminal surface 113a; a third conductor 130 connected with the first conductor 110; a semiconductor chip 140 including a first surface 141 and a second surface 142 away from the first surface, and bonded to the first conductor 110 and to the second conductor 120 via the second surface 142; and a resin package 150. The first surface 141 of the semiconductor chip 140 is provided with a first electrode electrically connected with the first conductor 110 via the third conductor 130. The second surface 142 is provided with a second electrode electrically connected directly with the second conductor 120. The resin package 150 seals the first conductor 110, the second conductor 120, the third conductor 130 and the semiconductor chip 140 while exposing the first terminal surface 113a and the second terminal surface 123a.

8 Claims, 36 Drawing Sheets

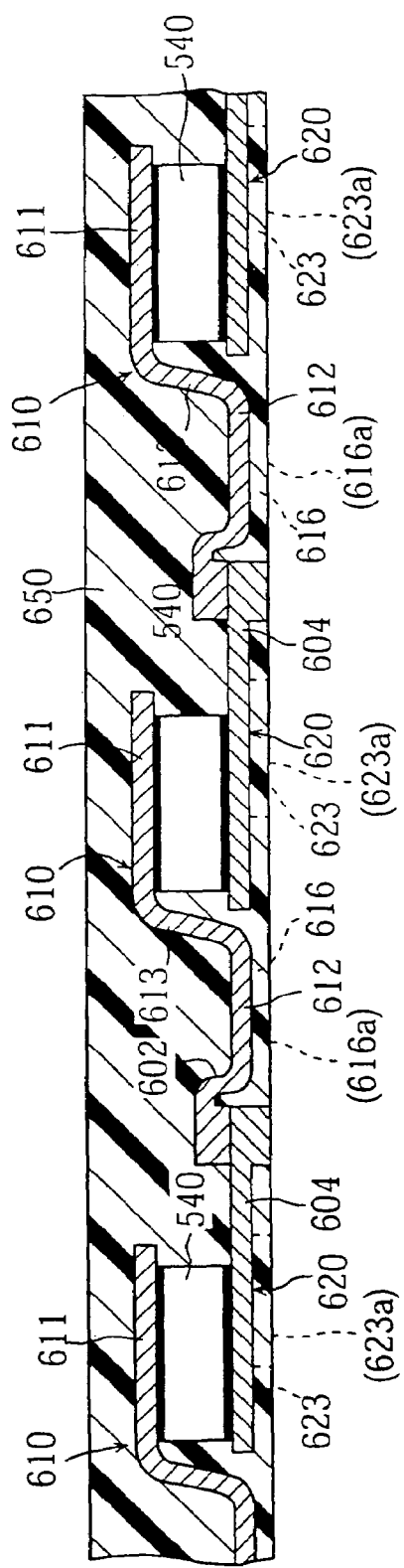
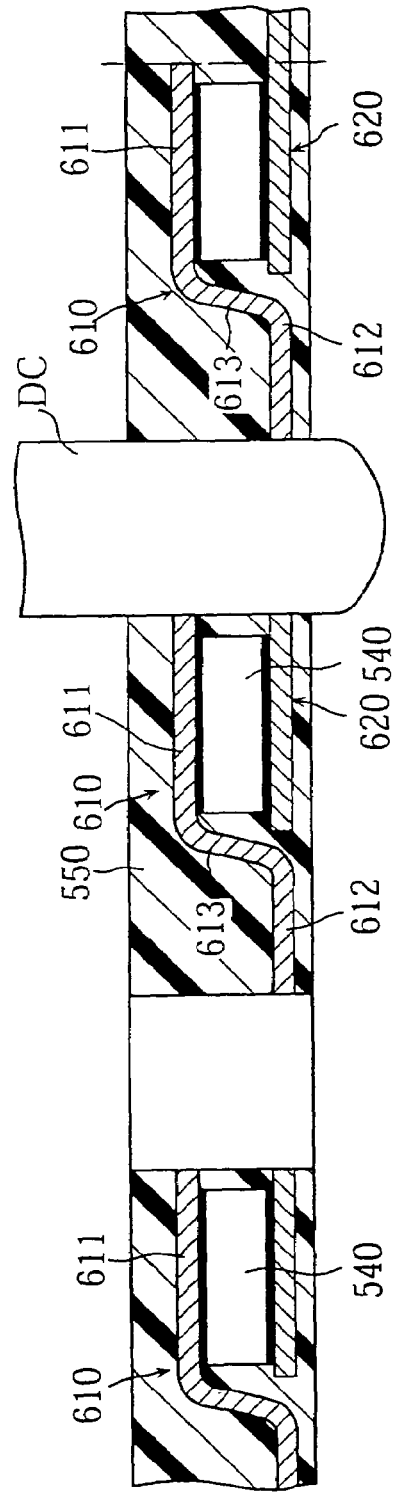

SURFACE-MOUNTING SEMICONDUCTOR DEVICE AND METHOD OF MAKING THE SAME

This application is a divisional application under 37 CFR § 1.53(b) of Ser. No. 10/786,403, filed on 23 Feb. 2004, now U.S. Pat. No. 6,989,585 which is a divisional of Ser. No. 10/044,231, filed 11 Jan. 2002, now U.S. Pat. No. 6,734,536 entitled SURFACE-MOUNTING SEMICONDUCTOR DEVICE AND METHOD OF MAKING THE SAME.

TECHNICAL FIELD

The present invention relates to a surface-mounting semiconductor device sealed in a resin package and having its terminals exposed on a bottom surface of the resin package.

BACKGROUND ART

FIG. 43 and FIG. 44 show a semiconductor device Y1 as an example of a conventional surface-mounting wire-type semiconductor device. FIG. 43 is a sectional view of the semiconductor device Y1. FIG. 44 is a perspective view of the semiconductor device Y1 taken on the side of a bottom surface.

The semiconductor device Y1 includes two first conductors 910, a second conductor 920, a semiconductor chip 930, wires 940 and a resin package 950. Each of the first conductors 910 includes a first terminal surface 911. The second conductor 920 includes two second terminal surfaces 921. The first terminal surfaces 911 and the second terminal surfaces 921 provide the semiconductor device Y1 with electrical connection with external terminals. The semiconductor chip 930 is mounted on the second conductor 920. The semiconductor chip 930 has a lower surface provided with a terminal (not illustrated) electrically connected with the second conductor 920. Each wire 940 provides electrical connection between a terminal (not illustrated) formed on an upper surface of the semiconductor chip 930 and one of the first conductors 910. The resin package 950 seals the first conductors 910, the second conductor 920, the semiconductor chip 930, and the wires 940 while exposing the first terminal surfaces 910 and the second terminal surfaces 921. The two first terminal surfaces 911 and the two second terminal surfaces 921 are in a same plane, on a bottom surface 950a of the resin package 950.

According to such a semiconductor device Y1, in order to avoid electrical discharge between mutually opposed conductors, as shown in FIG. 43, the first conductors 910 and the second conductor 920 must to be spaced from each other by a distance L6, which must be greater than a certain minimum value. This requirement poses a problem to size reduction of the conventional semiconductor device Y1.

There is another problem. Specifically, if the semiconductor device Y1 is a surface-mounting transistor for example, the number and the size of the terminals are standardized in general, in accordance with the size of the semiconductor device Y1. If a size (e.g. a length L7) of the semiconductor device Y1, a size (e.g. a length L8) of the first terminal surface 911, and so on are provided in accordance with the standards, a size (e.g. a length L9) of the second conductor 920 must be relatively small according to the conventional semiconductor device Y1. This limits a size (e.g. a length L10) of the semiconductor chip 930 mountable to the second conductor 920, leading to an occasional problem that a desired function cannot be achieved within a single semiconductor device.

FIG. 45 and FIG. 46 show a semiconductor device Y2 as an example of a conventional surface-mounting wireless-type semiconductor device. FIG. 45 is a perspective view of the semiconductor device Y2. FIG. 46 is a perspective view of the semiconductor device Y2 taken from the opposite side as in FIG. 45.

The semiconductor device Y2 includes a first conductor 910, a second conductor 920, a semiconductor chip 930, and a resin package 950. The first conductor 910 has a bent structure including a first portion 915, a second portion 916, and a third portion 917 in between. The first portion 915 is bonded to an electrode (not illustrated) provided on an upper surface of the semiconductor chip 930. The second portion 916 includes two first terminal surfaces 911. The second conductor 920 includes two second terminal surfaces 921. The semiconductor chip 930 is mounted on the second conductor 920. The semiconductor chip 930 has a lower surface provided with a terminal (not illustrated) which is electrically connected with the second conductor 920. According to the semiconductor device Y2, the resin package 950 seals the first conductor 910, the second conductor 920, the semiconductor chip 930 while exposing the first terminal surfaces 911 and the second terminal surfaces 921. The two first terminal surfaces 911 and the two second terminal surfaces 921 are in a same plane on a bottom surface 950a of the resin package 950.

According to the semiconductor device Y2, which includes the first conductor 910 as shown in FIG. 45 and FIG. 46, the third portion 917 provides electrical connection between the first terminal surfaces 911 and the electrode on the upper surface of the semiconductor chip 930, and it is difficult to dispose this third portion along a side surface 950b of the resin package 950, closely to the side surface 950b. Therefore, according to the semiconductor device Y2 of a given size, size of usable semiconductor chip 930 is limited. Likewise, the size of the semiconductor device Y2 must be increased if the semiconductor chip 930 to be mounted is larger than the second conductor 920.

The semiconductor device Y2 is conventionally made from a lead frame 960 as shown in FIG. 47. The lead frame 960 includes a first region 910A formed with a plurality of rectangular-shaped first conductor lands 910a each to serve as the first conductor 910, and a second region 920A formed with a plurality of second conductor lands 920a each to serve as the second conductor 920. In the manufacture of the semiconductor device Y2, each first conductor land 910a undergoes a press-folding step, for formation of the first portion 915, the second portion 916 and the third portion 917. Next, a semiconductor chip 930 is mounted on each second conductor land 920a. Next, the first region 910A is pivoted around a pair of bridge portions 961 and is overlapped onto the second region 920A, into a state as shown in FIG. 48, in a single unit of semiconductor device formation area.

In order to reliably bond the first conductor land 910a with the semiconductor chip 930 after the first region 910A is overlapped onto the second region 920A, during the above-mentioned press-folding step performed to the first conductor land 910a, the first conductor land 910a is folded so that the first portion 915 and the third portion 917 make an acute angle slightly smaller than shown in FIG. 48. If the first conductor land 910a is folded as such, during the overlapping step shown in FIG. 48, the first conductor land 910a urges the semiconductor chip 930 in a direction indicated by Arrow A.

However, the first conductor land 910a has a fixed base end 910a'. Therefore, if there is a large force acting in the direction indicated by Arrow A due to a bent of a border region between the first portion 915 and the third portion 917, a force develops which tends to increase the acute angle between the second portion 916 and the third portion 917. As a result, the border region between the second portion 916 and the third portion 917 is sometimes raised as indicated by Arrow B. If the border region between the second portion 916 and the third portion 917 is raised, the first terminal surface 911 of the second portion 916 is raised accordingly. It is conjectured that such a phenomenon is caused mainly by excessively high stiffness of the border region between the third portion 917 and the first portion 915, which generates a large repelling force in the first conductor land 910a when a force is applied which could deform the shape of the border region.

If such a state is not corrected before the semiconductor chip 930 and the other components are sealed into the resin package 950, the resin material invades into an underside of the first terminal surfaces 911 of the second portion 916. Specifically, a resulting semiconductor device Y2 has a resin package 950 having a bottom surface 950a which does not expose the first terminal surfaces 911 properly. Such a semiconductor device Y2 cannot be surface mounted properly, and therefore must be discarded, and this results in a decreased yield in the manufacture of the semiconductor device Y2.

The present invention was made under such a circumstance, and it is therefore an object of the present invention to eliminate or reduce the conventional problems, to provide a semiconductor device which is sufficiently small and surface-mountable, and to provide a method of making the same.

DISCLOSURE OF THE INVENTION

A first aspect of the present invention provides a semiconductor device. This semiconductor device comprises: a first conductor including a first terminal surface; a second conductor placed by the first conductor and including a second terminal surface facing a same direction as does the first terminal surface; a third conductor connected with the first conductor; a semiconductor chip including a first surface and a second surface away from the first surface, the first surface being provided with a first electrode electrically connected with the first conductor via the third conductor, the second surface being provided with a second electrode electrically connected directly with the second conductor, the semiconductor chip being bonded to the first conductor and the second conductor via the second surface; and a resin package sealing the first conductor, the second conductor, the third conductor and the semiconductor chip while exposing the first terminal surface and the second terminal surface.

Preferably, the third conductor includes a first portion connected with the first electrode and bonded to the first surface, and a second portion generally vertical to the first portion and connected with the first conductor.

Preferably, the first portion of the third conductor entirely covers the first surface of the semiconductor chip.

A second aspect of the present invention provides a method of making a semiconductor device. This method uses a lead frame including a semiconductor device formation area formed with a first conductor land and a second conductor land. The first conductor land has a first terminal surface, whereas the second conductor land is by the first conductor land and has a second terminal surface facing in a same direction as does the first terminal surface. The method comprises: a step of placing a semiconductor chip including a first surface formed with a first electrode and a second surface facing away from the first surface and formed with a second electrode, on the first conductor land and the second conductor land, via the second surface; a step of placing a third conductor so as to contact the first conductor land and the first surface of the semiconductor chip; a step of electrically connecting between the first conductor land and the third conductor, between the second electrode of the semiconductor chip and the second conductor land, and between the first electrode of the semiconductor chip and the third conductor; a step of sealing the first conductor, the second conductor, the third conductor and the semiconductor chip with a resin package while exposing the first terminal surface and the second terminal surface; and a step of cutting the first conductor land and the second conductor land from the lead frame.

A third aspect of the present invention provides another semiconductor device. This semiconductor device comprises a first conductor including a first terminal surface; a second conductor placed by the first conductor and including a second terminal surface facing in a same direction as does the first terminal surface; a third conductor connected with the first conductor; a semiconductor chip including a first surface and a second surface away from the first surface, the first surface being provided with a first electrode electrically connected with the first conductor via the third conductor, the second surface being provided with a second electrode electrically connected directly with the second conductor, the semiconductor chip being bonded to the first conductor and the second conductor via the second surface; and a resin package sealing the first conductor, the second conductor, the third conductor and the semiconductor chip while exposing the first terminal surface and the second terminal surface. The first conductor has a first thin portion opposed to the second conductor and receded toward the first terminal surface. The second conductor has a second thin portion opposed to the first conductor and receded from the second terminal surface.

Preferably, the third conductor includes a first portion connected with the first electrode and bonded to the first surface, and a second portion generally vertical to the first portion and connected with the first conductor.

Preferably, the first portion of the third conductor entirely covers the first surface of the semiconductor chip.

A fourth aspect of the present invention provides a method of making a lead frame from a metal plate having a first surface, second surface facing away therefrom, and a thickness as between the first surface and the second surface. The lead frame includes a first conductor land and a second conductor land opposed to each other at a space. The method comprises: a step of performing a first etching to a first region in the first surface, to a middle of the thickness; and a step of performing a second etching to a second region in the second surface, to a middle of the thickness. The second region is displaced with respect to the first region. The first etching and the second etching form a gap between the first conductor land and the second conductor land. The first etching forms a first thin portion receding from the first surface, on the first conductor land at a region opposed by the second conductor land. The second etching forms a second thin portion receding from the second surface, on the second conductor land at a region opposed by the first conductor land.

A fifth aspect of the present invention provides another semiconductor device. This semiconductor device comprises: a first conductor including a first portion, a second portion having a first terminal surface, and a third portion connecting the first portion and the second portion; a second conductor placed by the second portion, including a second terminal surface facing in a same direction as does the first terminal surface; a semiconductor chip including a first surface and a second surface away from the first surface, the first surface being provided with a first electrode electrically connected with the first portion, the second surface being provided with a second electrode electrically connected with the second conductor, the semiconductor chip being bonded to the second conductor via the second surface; and a resin package sealing the first conductor, the second conductor and the semiconductor chip while exposing the first terminal surface and the second terminal surface. The first portion and the third portion share a bent first border region. The second portion and the third portion share a bent second border region. The third portion is smaller than the first portion in width at the first border region, or the third portion is smaller than the second portion in width at the second border region.

Preferably, the first conductor has a shape of letter J, U or C, enclosing at least part of the semiconductor chip.

Preferably, the first portion of the first conductor entirely covers the first surface of the semiconductor chip and is bonded to the semiconductor chip.

A sixth aspect of the present invention provides another method of making a semiconductor device. This method uses a lead frame including a first region and a second region. The first region is formed with a first conductor land having a first portion, a second portion having a first terminal surface and a third portion connecting the first portion and the second portion. The second region is formed with a second conductor land having a second terminal surface. The method comprises: a step of folding the first conductor land, at a first border region between the first portion and the third portion and at a second border region between the second portion and the third portion; a step of placing a semiconductor chip on the first portion of the first conductor land, or on the second conductor land; a step of overlapping the first region and the second region with each other, via the semiconductor chip; a step of electrically connecting between the first portion of the first conductor land and the semiconductor chip and between the second conductor land and the semiconductor chip; a step of sealing the first conductor, the second conductor and the semiconductor chip with a resin package while exposing the first terminal surface and the second terminal surface; and a step of cutting the first conductor land and the second conductor land from the lead frame. The third portion is smaller than the first portion in width at the first border region, or the third portion is smaller than the second portion in width at the second border region.

Preferably, the folding of the first conductor land in the step of folding the first conductor land leaves the second portion to extend from the third portion in a direction away from the first portion.

Preferably, the second portion includes a pair of projections each having the first terminal surface. The third portion connects to the second portion at a region between the pair of projections. The second border region is between the region sandwiched by the pair of projections and the third portion. The width of the third portion at the second border region is smaller than a distance between the pair of projections.

Preferably, the second border region is formed with a pair of cutouts extending in an opposite direction from the extending direction of the third portion, at an interval corresponding to the width of the third portion. The pair of cutouts is utilized for folding the third portion with respect to the second portion, in the step of folding the first conductor land.

Preferably, the third portion is thinner than the first portion in the first border region.

Preferably, the third portion is thinner than the second portion in the second border region.

BRIEF DESCRIPTION OF THE DRAWINGS

FIG. 32 is a fragmentary sectional view as after a step of resin packaging.

FIG. 33 shows a step of cutting.

BEST MODE FOR CARRYING OUT THE INVENTION

Figure 1:
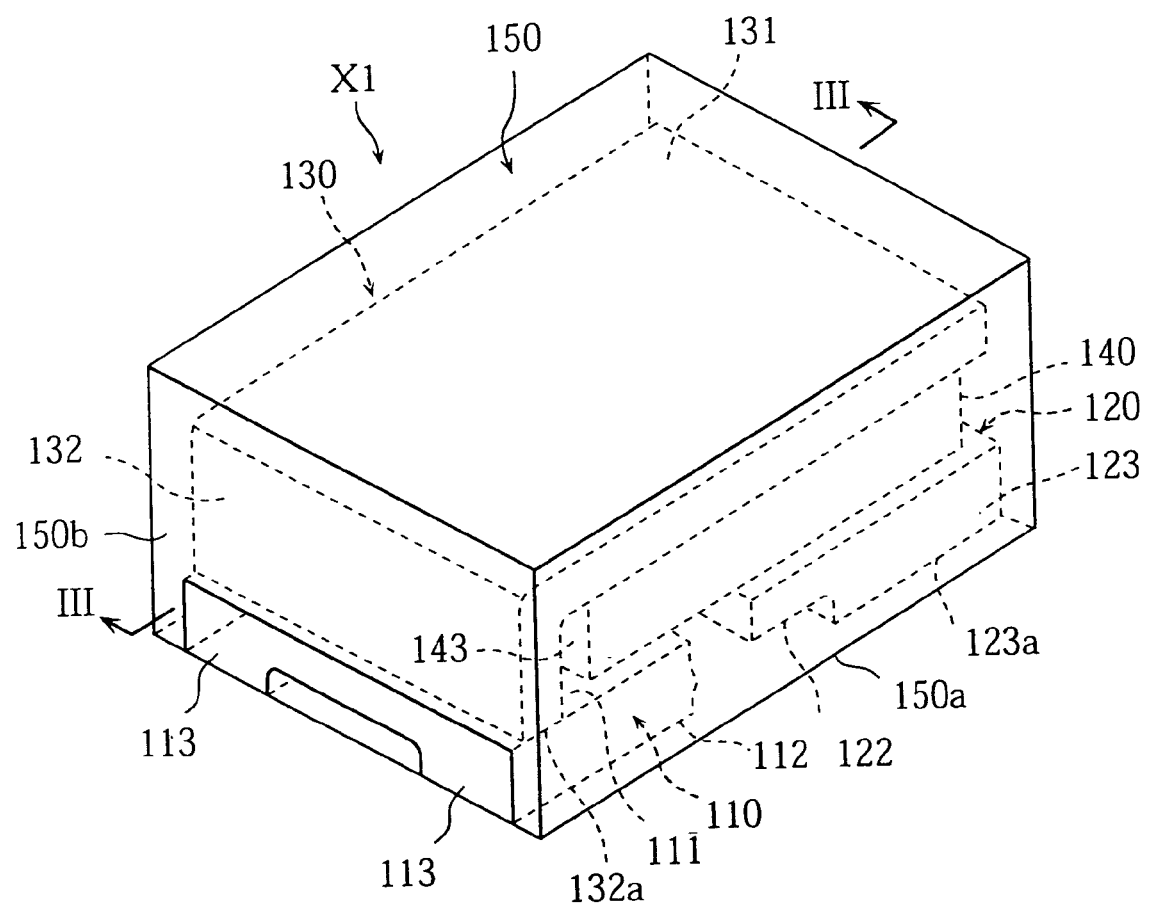
FIG. 1 is a perspective view of a semiconductor device according to a first embodiment of the present invention.
Figure 2:
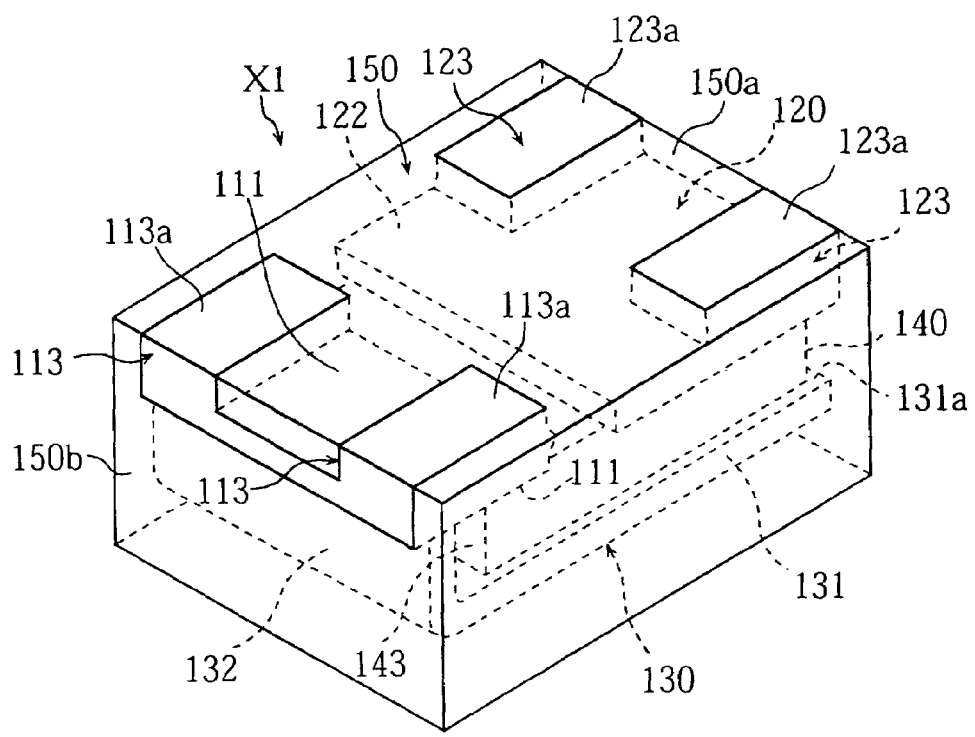
FIG. 2 is a perspective view of the semiconductor device in FIG. 1 viewed from the opposite side as in FIG. 1.
Figure 3:
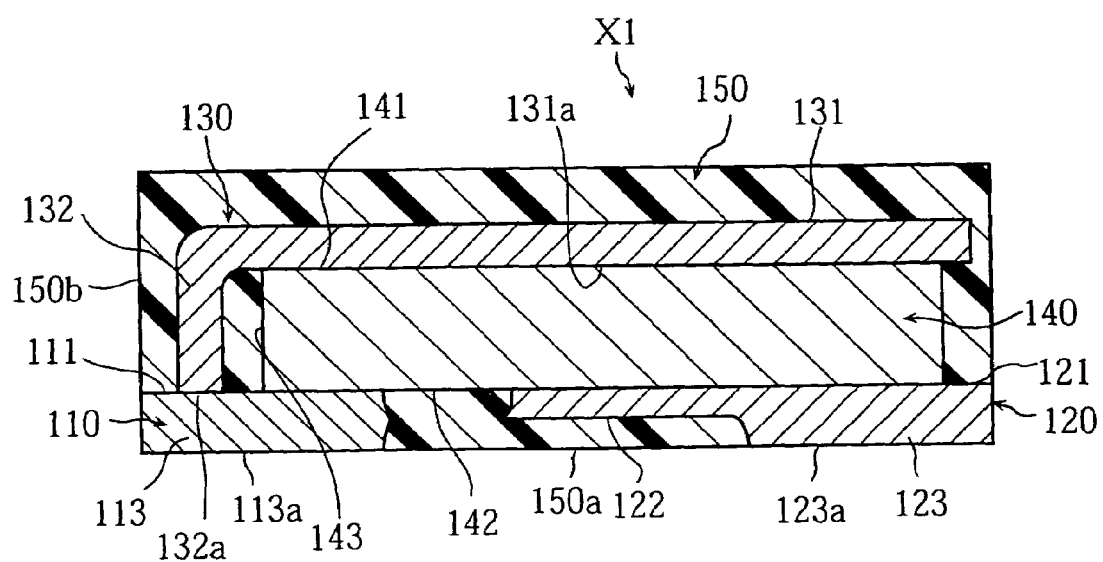
FIG. 3 is a sectional view taken in lines III-III in FIG. 1.

FIG. 1 through FIG. 3 show a semiconductor device X1 according to a first embodiment of the present invention. FIG. 1 is a perspective view of the semiconductor device X1. FIG. 2 is a perspective view of the semiconductor device X1 viewed from the opposite side as in FIG. 1. FIG. 3 is a sectional view taken in lines III-III in FIG. 1.

The semiconductor device X1 is of a surface-mountable wireless type, and includes a first conductor 110, a second conductor 120, a third conductor 130, a semiconductor chip 140 and a resin package 150.

The first conductor 110 has a flat first surface 111 and a second surface 112 away therefrom. The second surface 112 has two ends provided with a pair of projections 113. Each of the projections 113 has a first terminal surface 113a which exposes on a bottom surface 150a of the resin package 150 for contact with an external terminal.

The second conductor 120 has a flat first surface 121 and a second surface 122 away therefrom. The second surface 122 is provided with a pair of projections 123. Each of the projections 123 has a second terminal surface 123a which exposes on the bottom surface 150a of the resin package 150 for contact with an external terminal. The first conductor 110 and the second conductor 120 have their respective first terminal surfaces 113a and the second terminal surfaces 123a on a same plane, and are spaced from each other by a predetermined distance. The projections 113, 123 are formed by means of half etching for example, performed to regions of the second surfaces 112, 122 other than the regions to serve as the projections 113, 123.

The third conductor 130 has a base portion 131 as a first portion, and a bent portion 132 as a second portion. As shown in FIG. 3, the third conductor 130 has an L-shaped section. Specifically, the base portion 131 and the bent portion 132 make generally a right angle. The bent portion 132 has a tip surface 132a bonded to the first surface 111 of the first conductor 110a, via an electrically conductive material such as solder.

The semiconductor chip 140 is a bear chip such as a diode, and has a first surface 141 and a second surface 142. Each of the first surface 141 and the second surface 142 has an electrode (not illustrated). The semiconductor chip 140 is mounted on the first conductor 110 and the second conductor 120 like a bridge on the first conductor 110 and the second conductor 120. More specifically, the second surface 142 of the semiconductor chip 140 is bonded, via solder for example, to the first surface 111 of the first conductor 110 and the first surface 121 of the second conductor. As a result, as shown clearly in FIG. 3, part of the first conductor 110 comes right below the semiconductor chip 140.

According to such an arrangement, part of the first conductor 110 which has the first terminal surface 113a is located right below the semiconductor chip 140. Therefore, it is possible to reduce limitation to the size of the semiconductor chip 140. Specifically, it becomes possible to provide the bent portion 132 of the third conductor 130, which provides electrical connection between the first conductor 110 and the semiconductor chip 140, along a side surface 150b of the resin package 150, and closely to the side surface 150b. This enables to mount the semiconductor chip 140 on the first conductor 110 and the second conductor 120, like a bridge on the first conductor 110 and the second conductor 120. As a result, it becomes possible to use a larger semiconductor chip 140 than conventionally possible, in a given size of the semiconductor device X1. Specifically, to the extent that the semiconductor chip 140 has its side surface 143 placed closer to the bent portion 132, size of the mountable semiconductor chip 140 increases. Likewise, for a given size of the semiconductor chip 140, it becomes possible to decrease the size of the semiconductor device X1. Thus, according to the semiconductor device X1, limit to the size of the semiconductor chip 140 is reduced.

Figure 43:
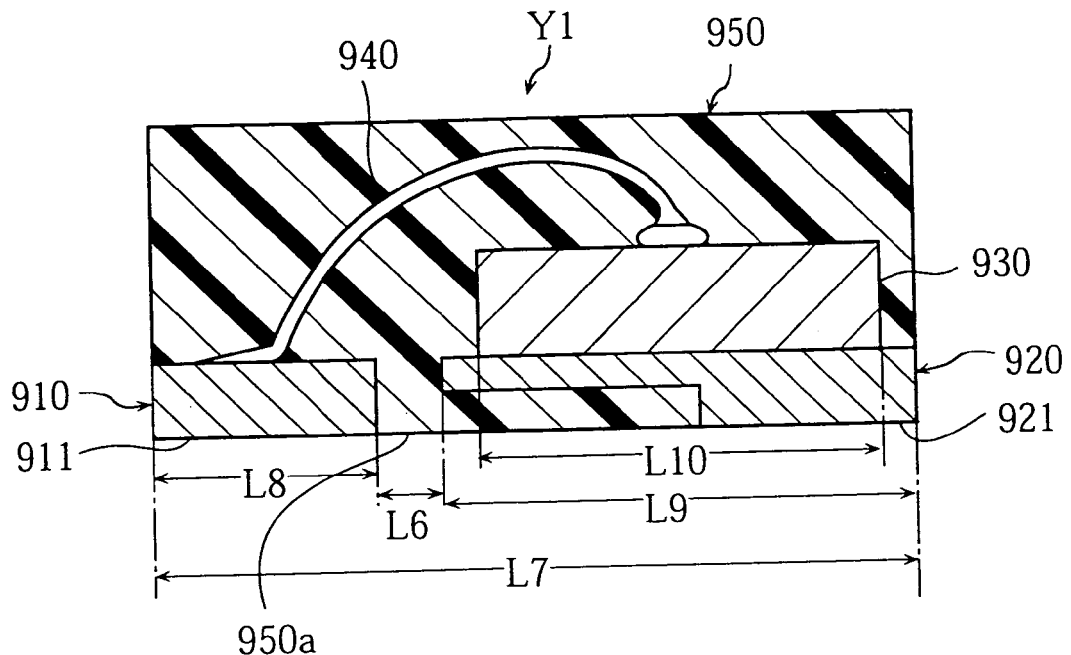
FIG. 43 is a sectional view of a conventional wire-type semiconductor device.
Figure 44:
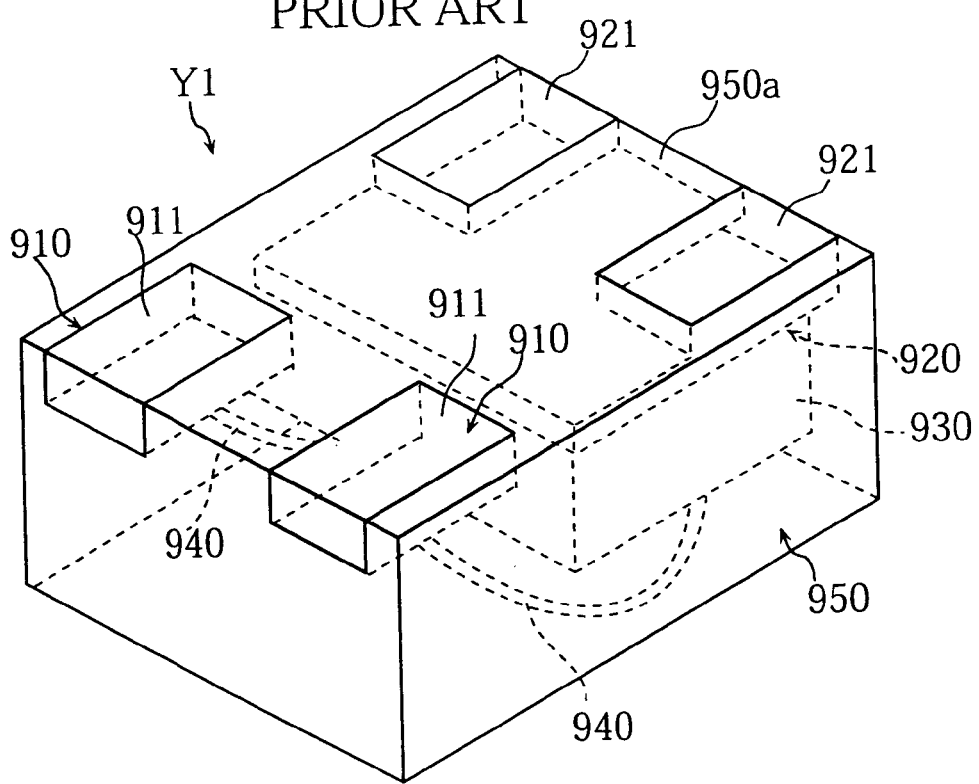
FIG. 44 is a perspective view of the semiconductor device in FIG. 43 taken from the side of a bottom surface.
Figure 45:
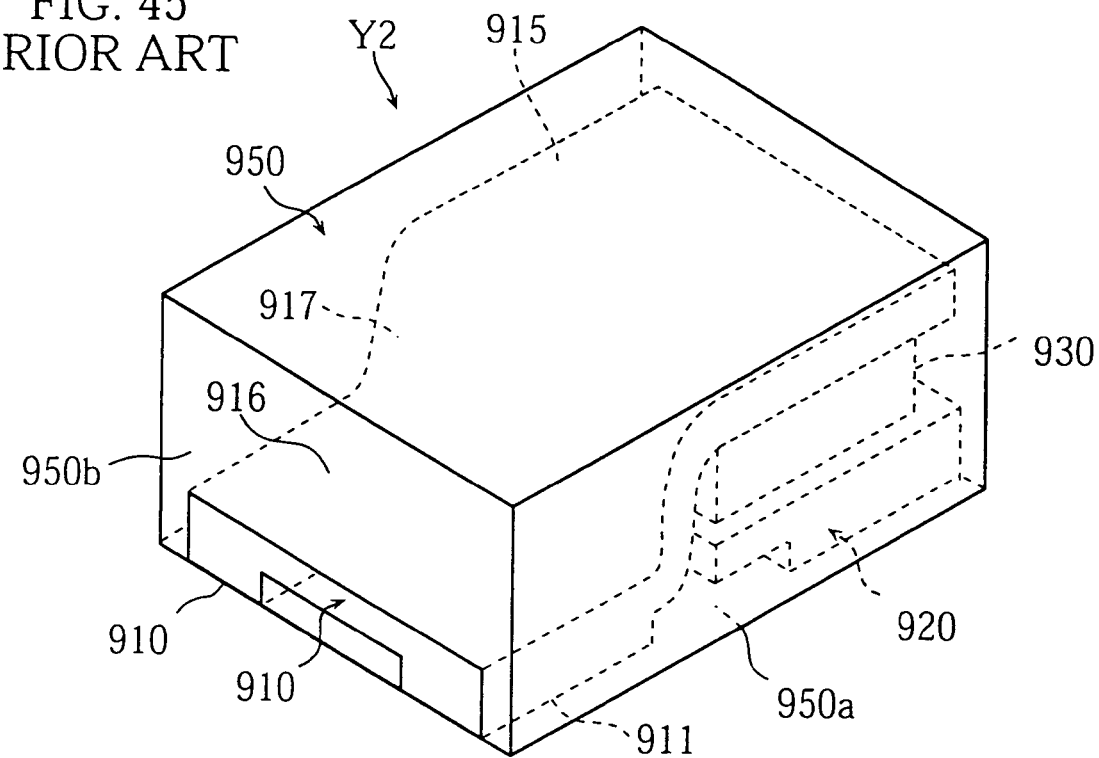
FIG. 45 is a perspective view of a conventional wireless semiconductor device.
Figure 46:
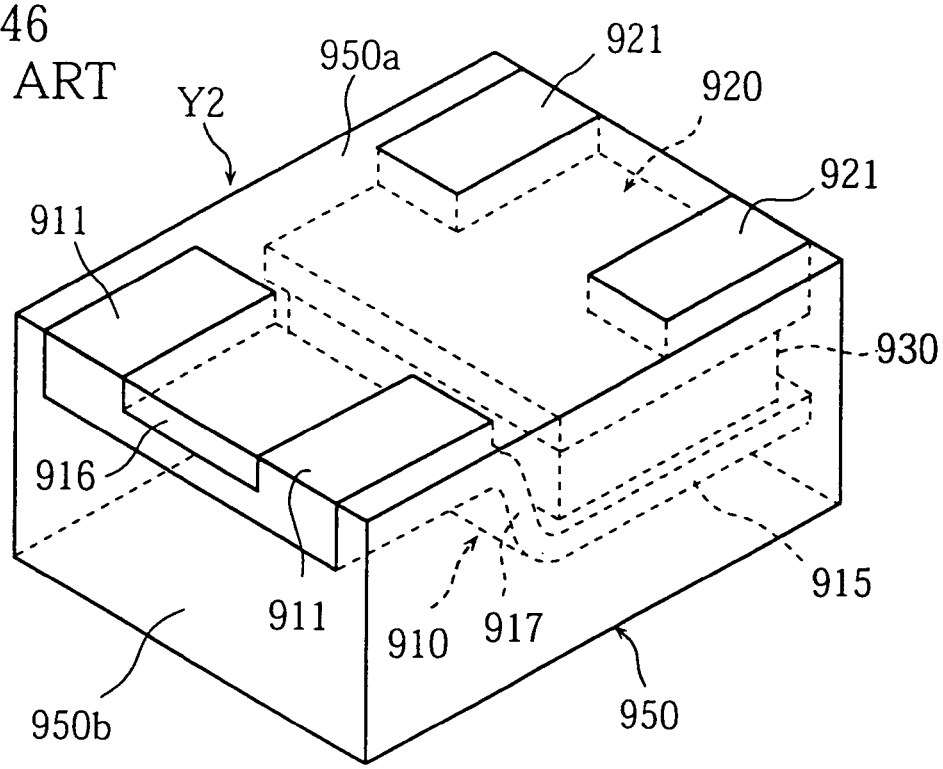
FIG. 46 is a perspective view of the semiconductor device in FIG. 45 viewed from the opposite side as in FIG. 45.
Figure 47:
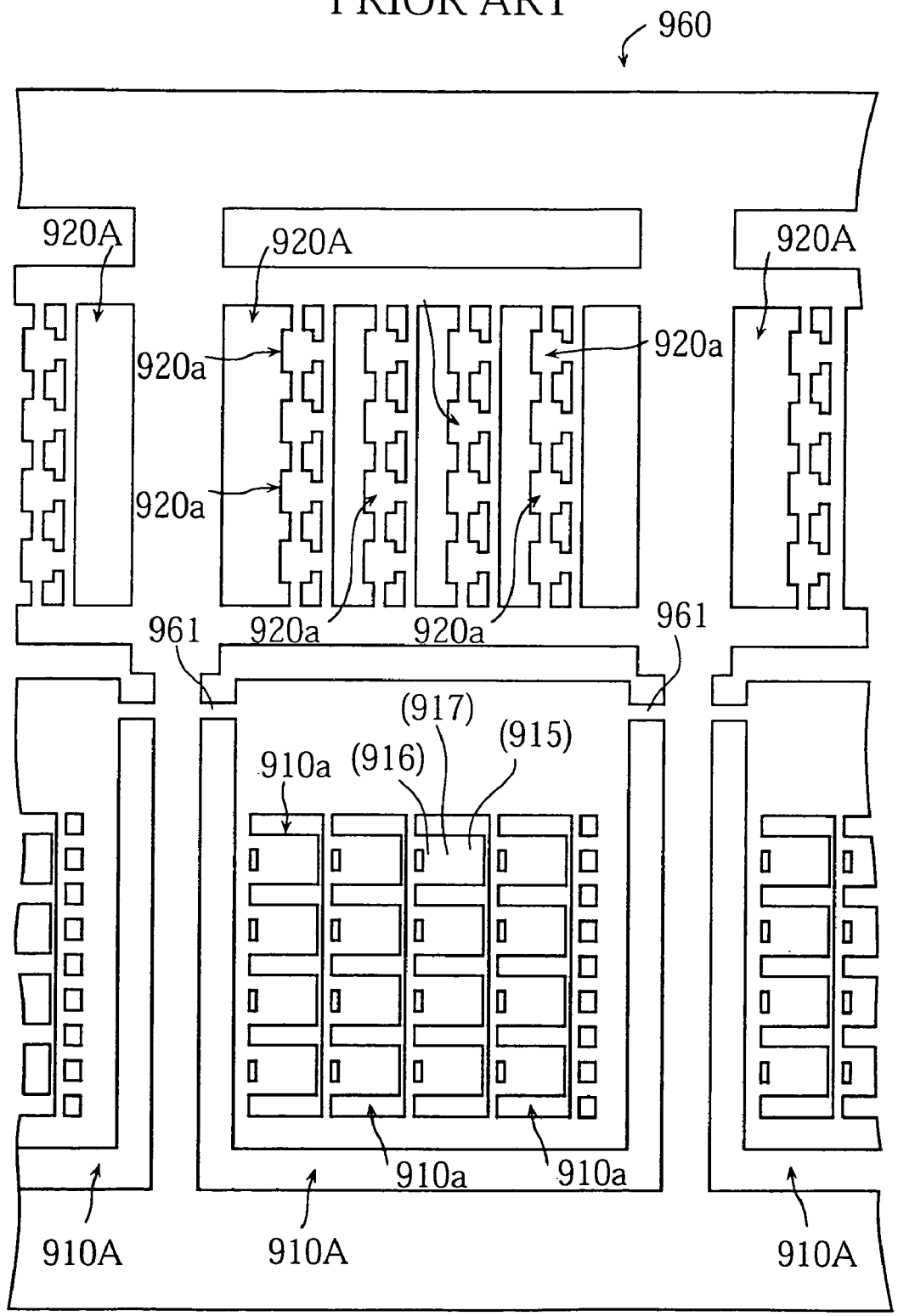
FIG. 47 is a fragmentary plan view of a lead frame used for making of the semiconductor device in FIG. 45.
Figure 48:
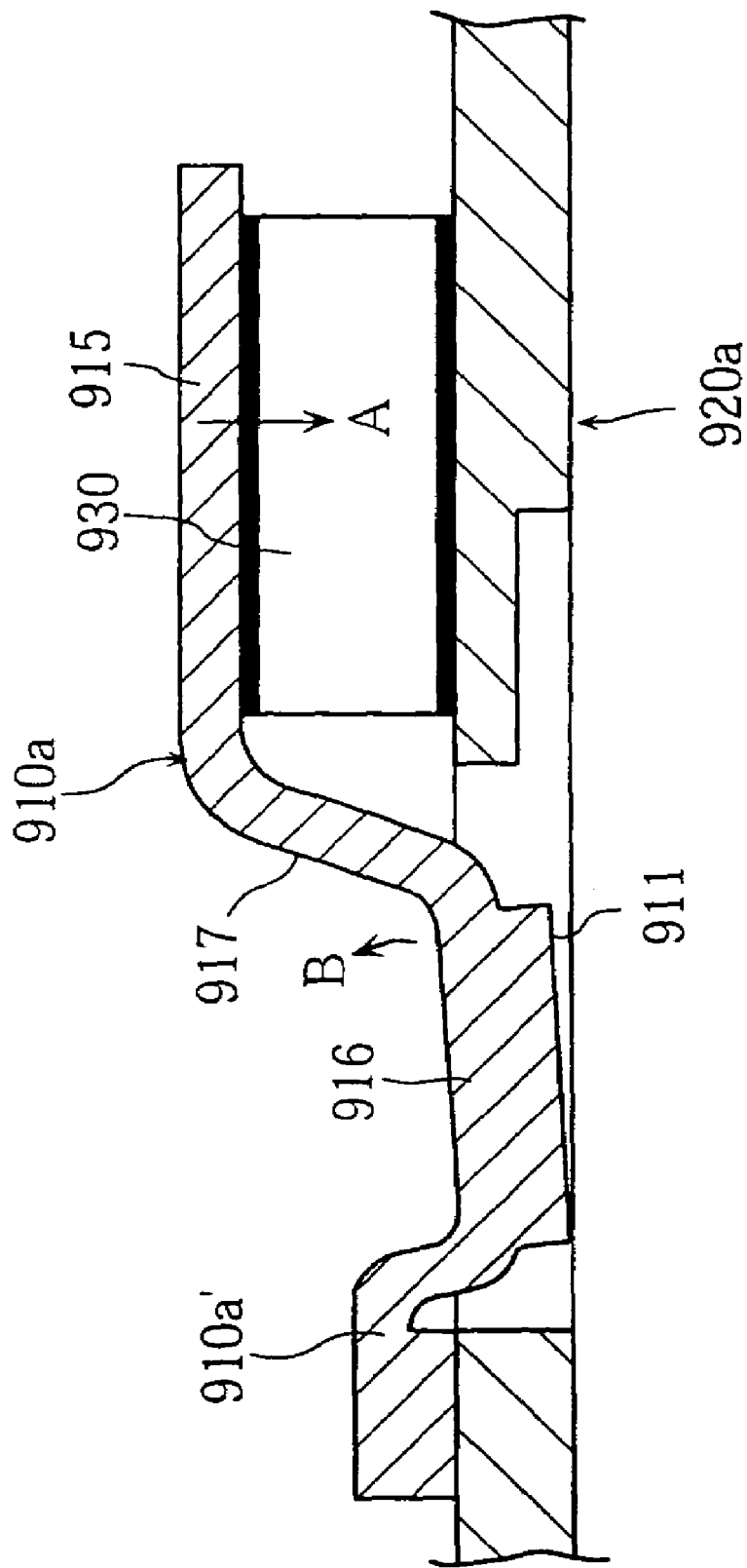
FIG. 48 is a sectional view of a principal portion, as after a first region and a second region of the lead frame in FIG. 45 are overlapped with each other.

The first surface 141 of the semiconductor chip 140 is soldered to an inner surface 131a of the base portion 131 of the third conductor 130. The base portion 131 entirely covers the first surface 141 of the semiconductor chip 140. The first surface 141 of the semiconductor chip 140 is not contacted by a resin material, and is covered by an electrically conductive material which has a higher thermal conductivity than a resin material. Therefore, the semiconductor device X1 is superior to the wire-type semiconductor device Y1 shown in FIG. 43 and FIG. 44, in heat radiation and protection against noise caused by e.g. external light.

The resin package 150 seals the first conductor 110, the second conductor 120, the third conductor 130, and the semiconductor chip 140 while exposing the two first terminal surfaces 113a and the two second terminal surfaces 123a. The resin package 150 is formed of e.g. an epoxy resin by means of a transfer-molding method.

Figure 4:
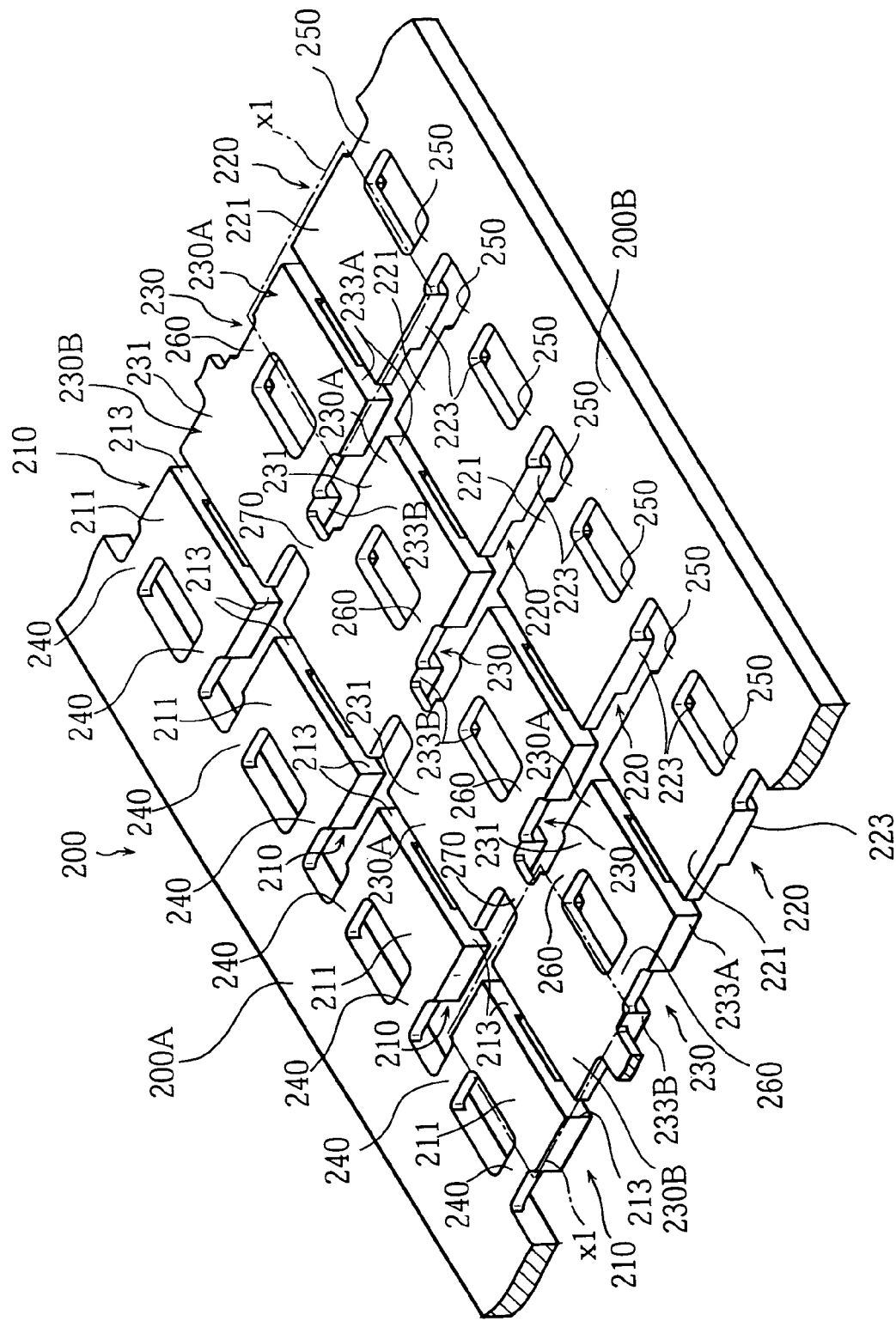
FIG. 4 is a fragmentary perspective view of a lead frame used for making the semiconductor device in FIG. 1.
Figure 5:
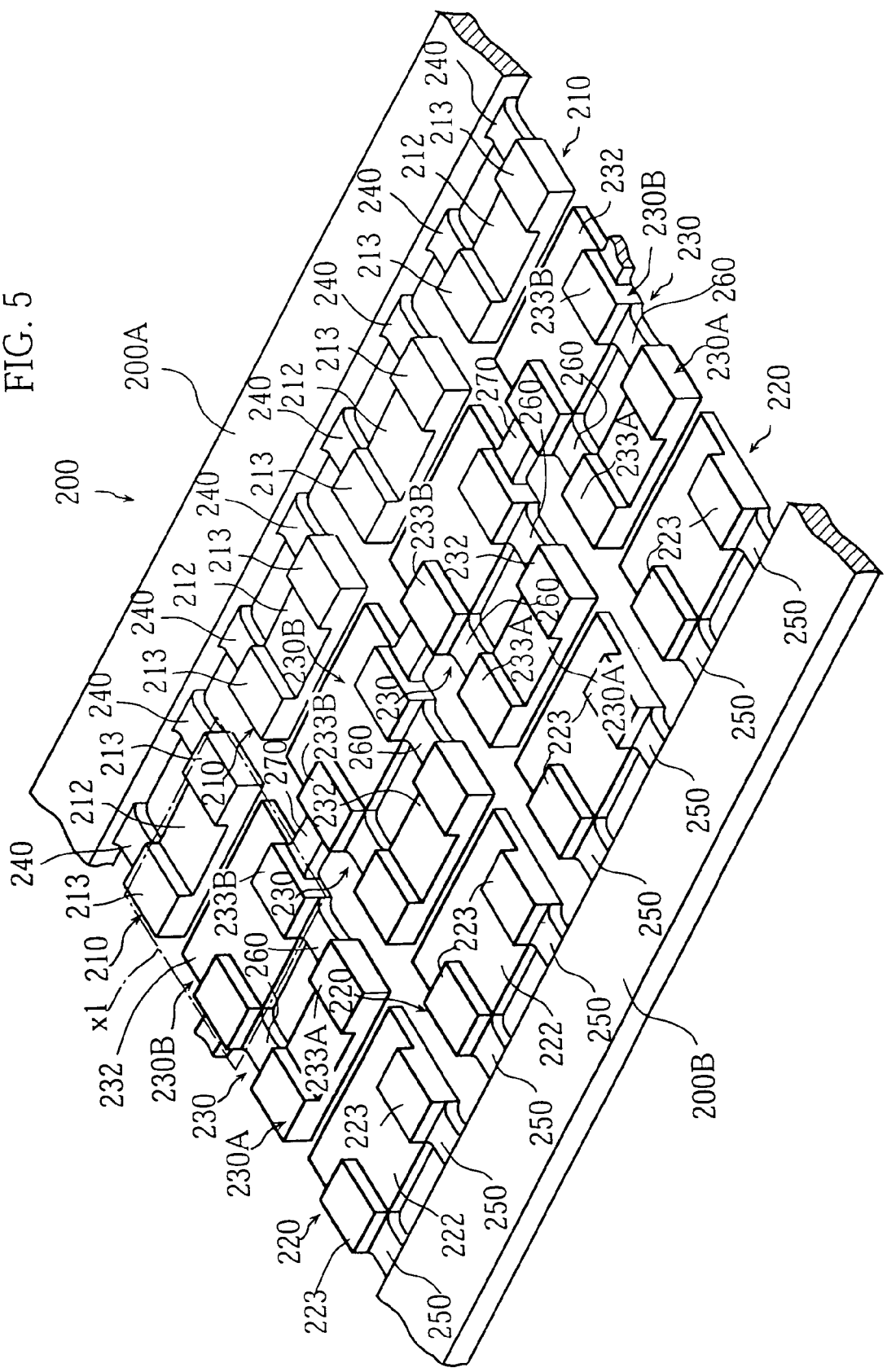
FIG. 5 is a fragmentary perspective view of the lead frame in FIG. 4 viewed from the opposite side as in FIG. 4.

Reference is made now to FIG. 4 through FIG. 8 for describing a method of making the semiconductor device X1. The semiconductor device X1 is made from a lead frame 200 as shown in FIG. 4 and FIG. 5. The lead frame 200 includes two rows of semiconductor device formation areas x1. One semiconductor device formation area x1 yields one semiconductor device X1, and is shown enclosed by dashed lines in FIG. 4.

The lead frame 200 includes a pair of side members 200A, 200B and a pair of cross members (not illustrated) connecting the side members together. The side members 200A, 200B and the cross members define a frame, in which there is formed a plurality of first regions 210, second regions 220 and third regions 230 to serve as the first conductor 110 and the second conductor 120 of the semiconductor device X1. The first regions 210 are along the side member 200A, extending from the side member 200A toward the side member 200B. The second regions 220 are along the side member 200B, extending from the side member 200B toward the side member 200A. Each of the third regions 230 is between a corresponding pair of the first region 210 and the second region 220.

Each first region 210 corresponds to a first conductor land according to the present invention, and includes the flat first surface 211 shown in FIG. 4 and the second surface 212 formed with a pair of projections 213 shown in FIG. 5. The first region 210 as a whole is essentially the same as the first conductor 110 of the semiconductor device X1. The first region 210 is connected with the side member 200A via a pair of bridge portions 240. The bridge portions 240 are thinner than the side member 200A and the portion of the first region 210 where the projections 213 are formed.

Each second region 220 corresponds to the second conductor land according to the present invention, and includes the flat first surface 221 shown in FIG. 4 and the second surface 222 formed with a pair of projections 223 shown in FIG. 5. The second region 220 as a whole is essentially the same as the second conductor 120 of the semiconductor device X1. The second region 220 is connected with the side member 200B via a pair of bridge portions 250. The bridge portions 250 are thinner than the side member 200B and the portion of the second region 220 where the projections 223 are formed.

Each third region 230 includes a first portion 230A which corresponds to the first region 210 or the first conductor land, a second portion 230B which corresponds to the second region 220 or the second conductor land, and bridge portion 260 which connect these regions with each other. The third region 230 has the flat first surface 231 shown in FIG. 4 and the second surface 232 formed with two projections 233A and two projections 233B shown in FIG. 5. The third region 230 is connected with adjacent ones via bridge portions 270. The bridge portions 260, 270 are thinner than the side member 200A, 200B and the portion of the third region where the projections 233A, 233B are formed.

The lead frame 200 having such an arrangement is formed from a metal plate of e.g. copper or nickel by means of etching. Specifically, half etching is performed on one surface of the lead frame 200 to a predetermined depth, to form the thinner regions or portions, and half etching is performed on both surfaces to form through holes penetrating the metal plate. For example, when making the lead frame 200, each of the metal surfaces is first covered by a mask formed with openings correspondingly to regions to be etched. Then, the metal plate is soaked into an etching solution, and after the etching is complete, the masks are removed.

Figure 6:
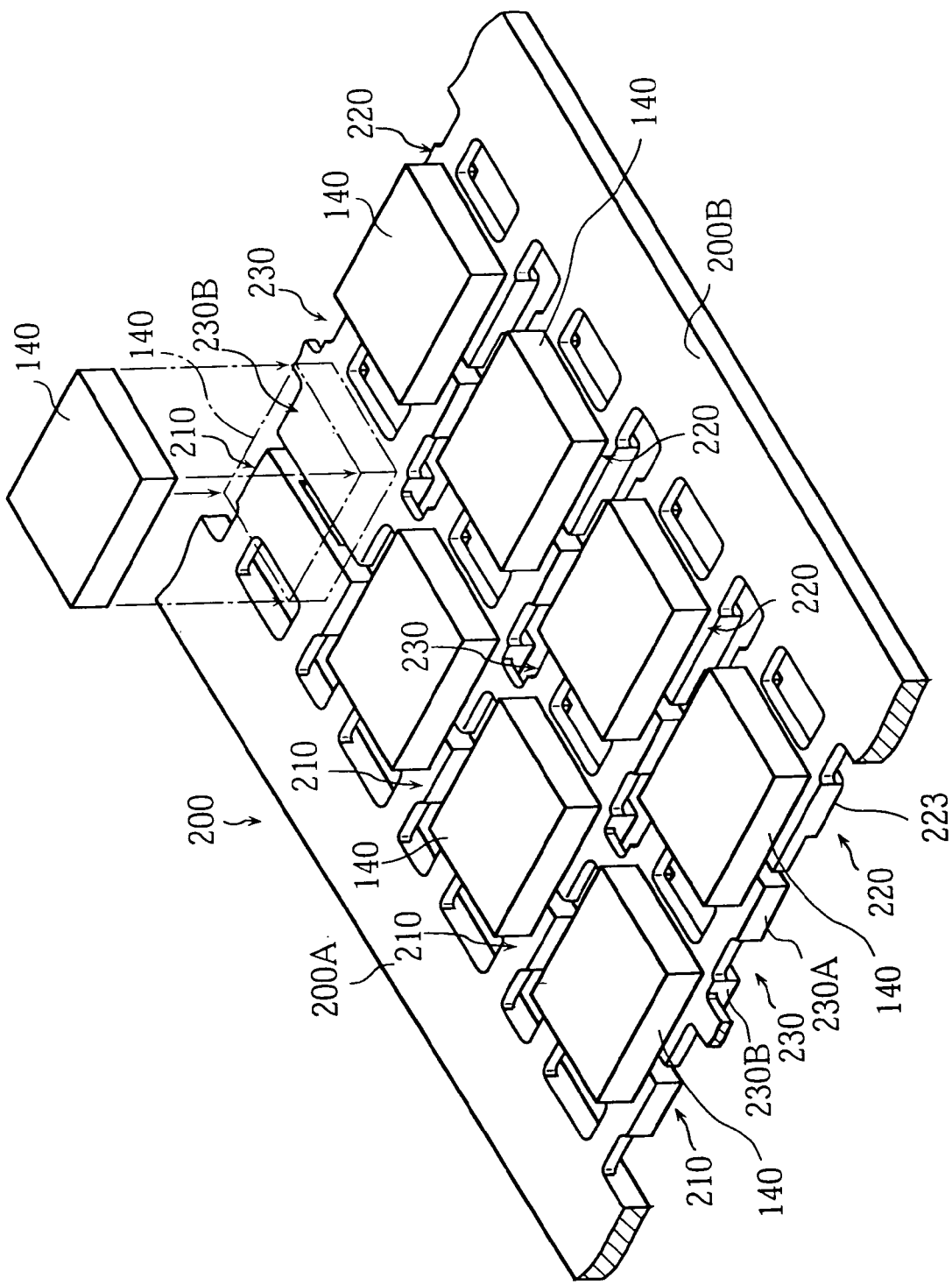
FIG. 6 shows a step of placing a semiconductor chip according to a method of making the semiconductor device in FIG. 1.

The lead frame 200 thus made has then its first surfaces 211, 221 and 231 respectively of the first region 210 through the third region 230, applied with electrically conductive paste such as cream solder. Then, a plurality of semiconductor chips 140 are mounted. As shown in FIG. 6, the semiconductor chips 140 are mounted onto the lead frame 200 in two rows respectively along the side members 200A, 200B. More specifically, the mounting is performed by a conventional chip mounter on a first surface of the lead frame 200, so that each of the semiconductor chips 140 bridges between the first region 210 and the second portion 230B of the third region 230 or between the first portion 230A of the third region 230 and the second region 220.

Figure 7:
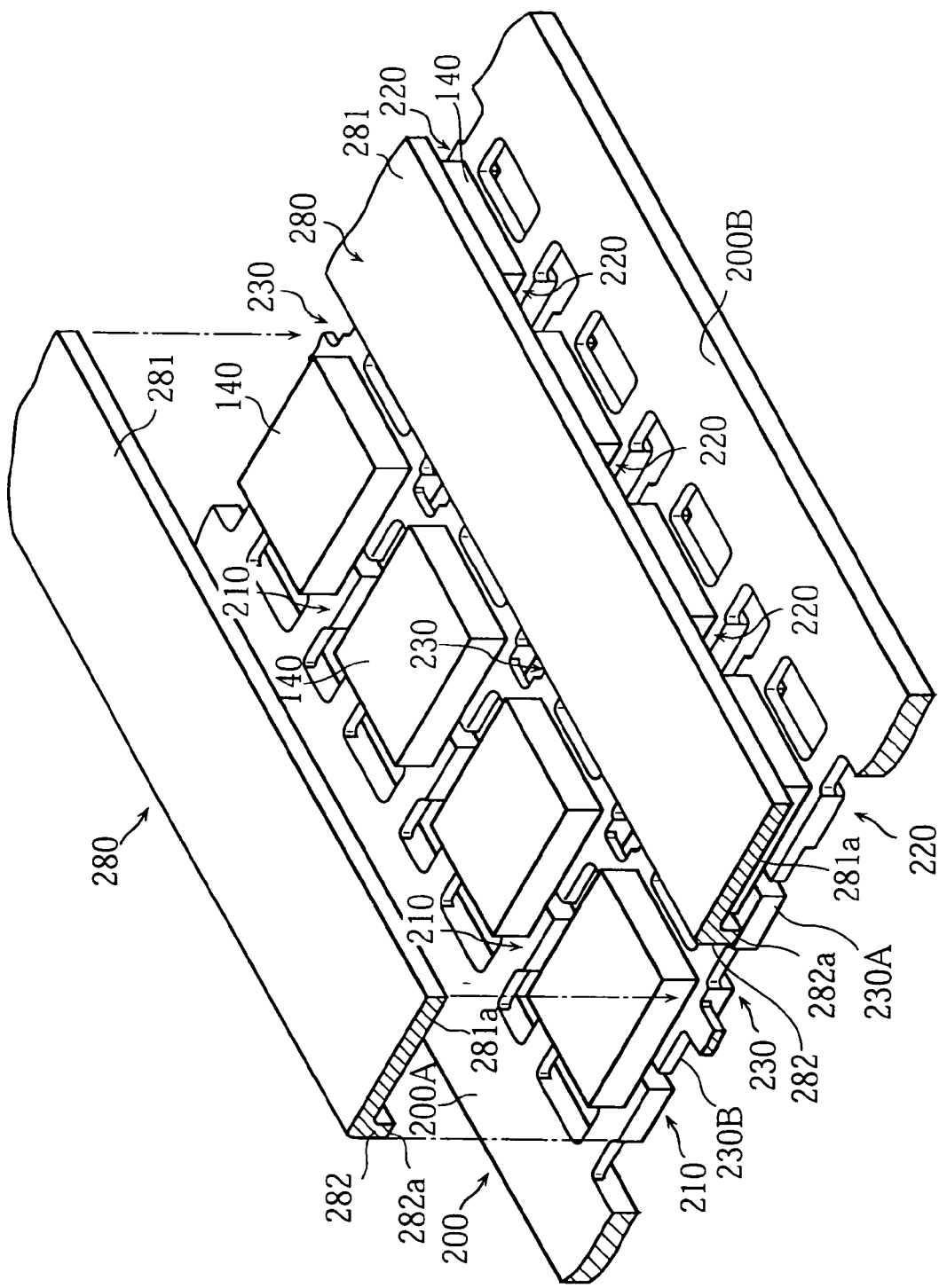
FIG. 7 shows a step of placing a third conductor according to the method of making the semiconductor device in FIG. 1.

Next, as shown in FIG. 7, third conductor pieces 280 are placed so as to cover the two rows of semiconductor chips 140 respectively. The third conductor piece 280 includes a base portion 281 and a bent portion 282, and has an L-shaped section. The third conductor piece 280 is placed on the lead frame 200, with the base portion 281 contacted with the first surface 141 of each semiconductor 140, and with a tip surface 282a of the bent portion 282 contacted with the first surface 211 of each first region 210 or the first surface 231 of the first portion 230A of the third region 230. The base portion 281 of the third conductor piece 280 has an inner surface 281a, to which electrically conductive paste such as cream solder is applied in advance.

Figure 8:
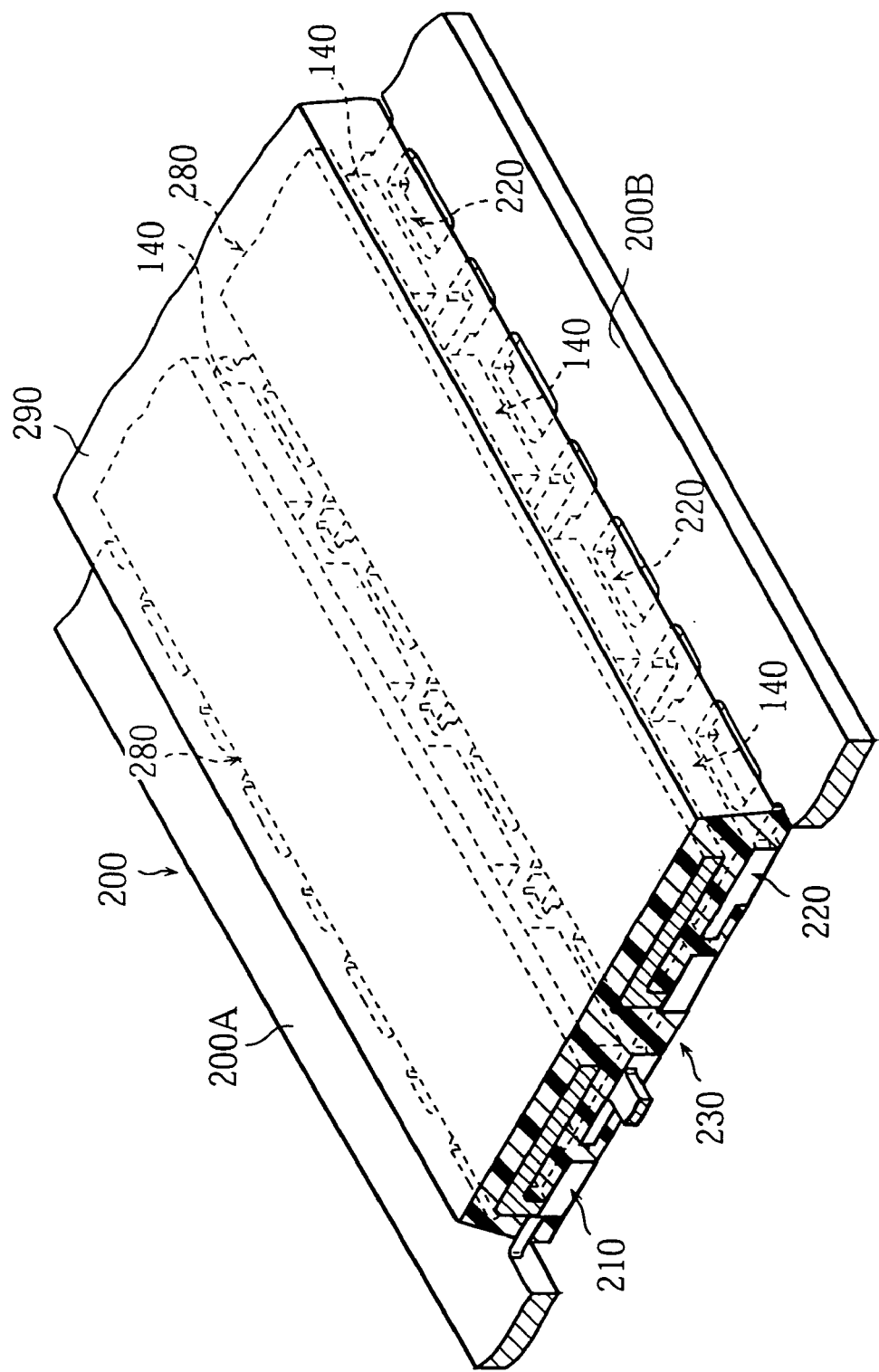
FIG. 8 shows a step of resin packaging according to the method of making the semiconductor device in FIG. 1.

Next, as shown in FIG. 8, a resin package 290 is formed to seal the third conductor pieces 280, the semiconductor chips 140 as well as the first region 210 through the third region 230. The resin package 290 is formed for an entire region of a plurality of the semiconductor device formation areas x1, by using a pair of metal mold halves (not illustrated) which provides a cavity when the halves are closed. The formation of the resin package 290 is made, for example, by first placing the semiconductor chips 140, the third conductor pieces 280 and other components in the cavity provided by the mold, then injecting e.g. an epoxy resin into the cavity, allowing the resin to set thermally, and finally removing the mold.

Next, along an outer perimeter of each of the semiconductor device formation areas x1 in the lead frame 200, cutting is made by using a diamond cutter for example, to the resin package 290, the bridge portions 240, 250, 260, 270. As a result, single-piece semiconductors X1 as shown in FIG. 1 through FIG. 3 are obtained.

Figure 9:
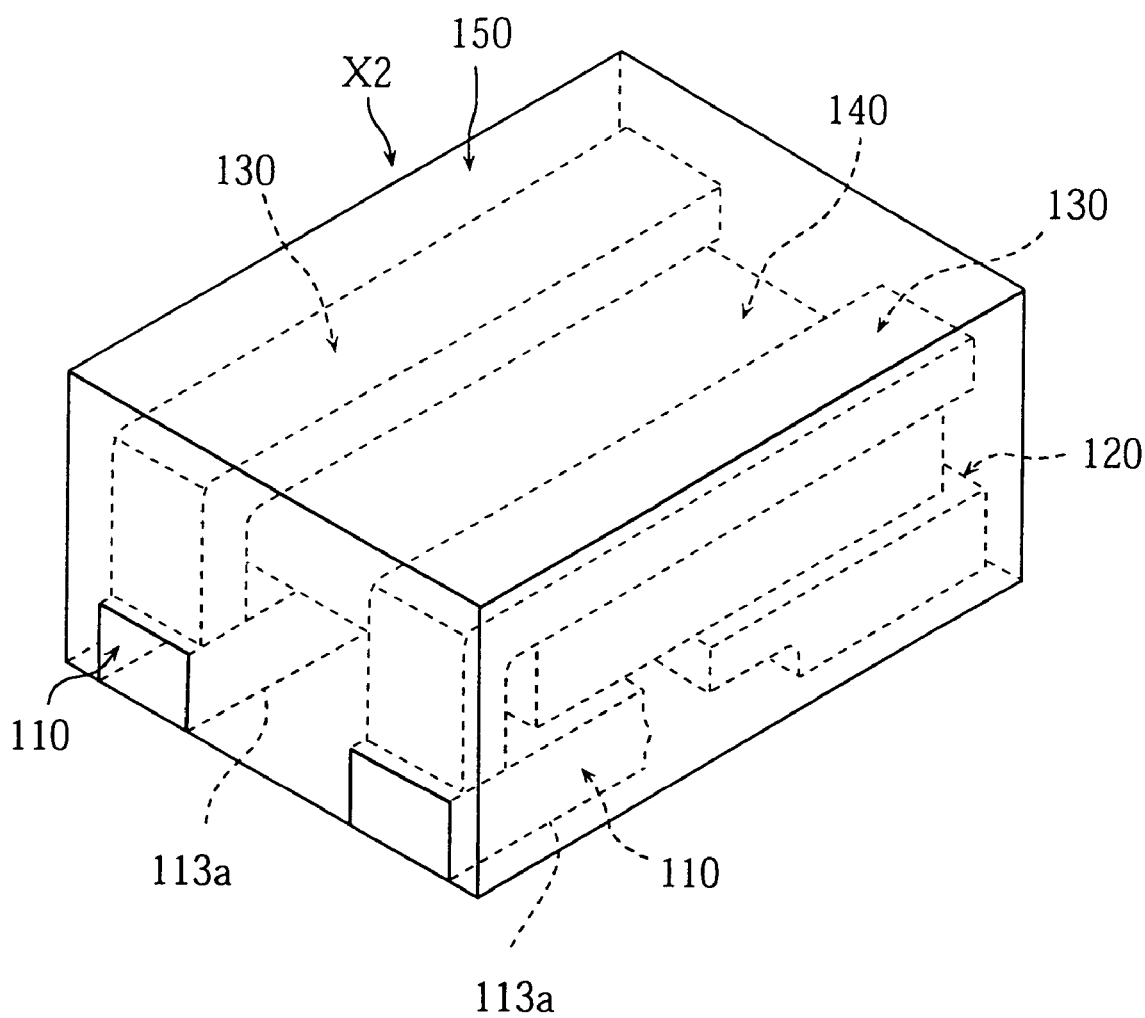
FIG. 9 is a perspective view of a semiconductor device according to a second embodiment of the present invention.

FIG. 9 shows a semiconductor device X2 according to a second embodiment of the present invention. The semiconductor device X2 has two first conductors 110 each having the first terminal surface 113a, and has two third conductors 130, thereby differing from the semiconductor device X1. When the semiconductor chip 140 is provided by a transistor for example, an arrangement such as in the semiconductor device X2 is suitable. According to the present invention, depending on the number and position of electrodes formed in the semiconductor chip 140, the semiconductor device may include two third conductors 130 and one first conductor 110. Likewise, the semiconductor device may include three or more third conductors.

Figure 10:
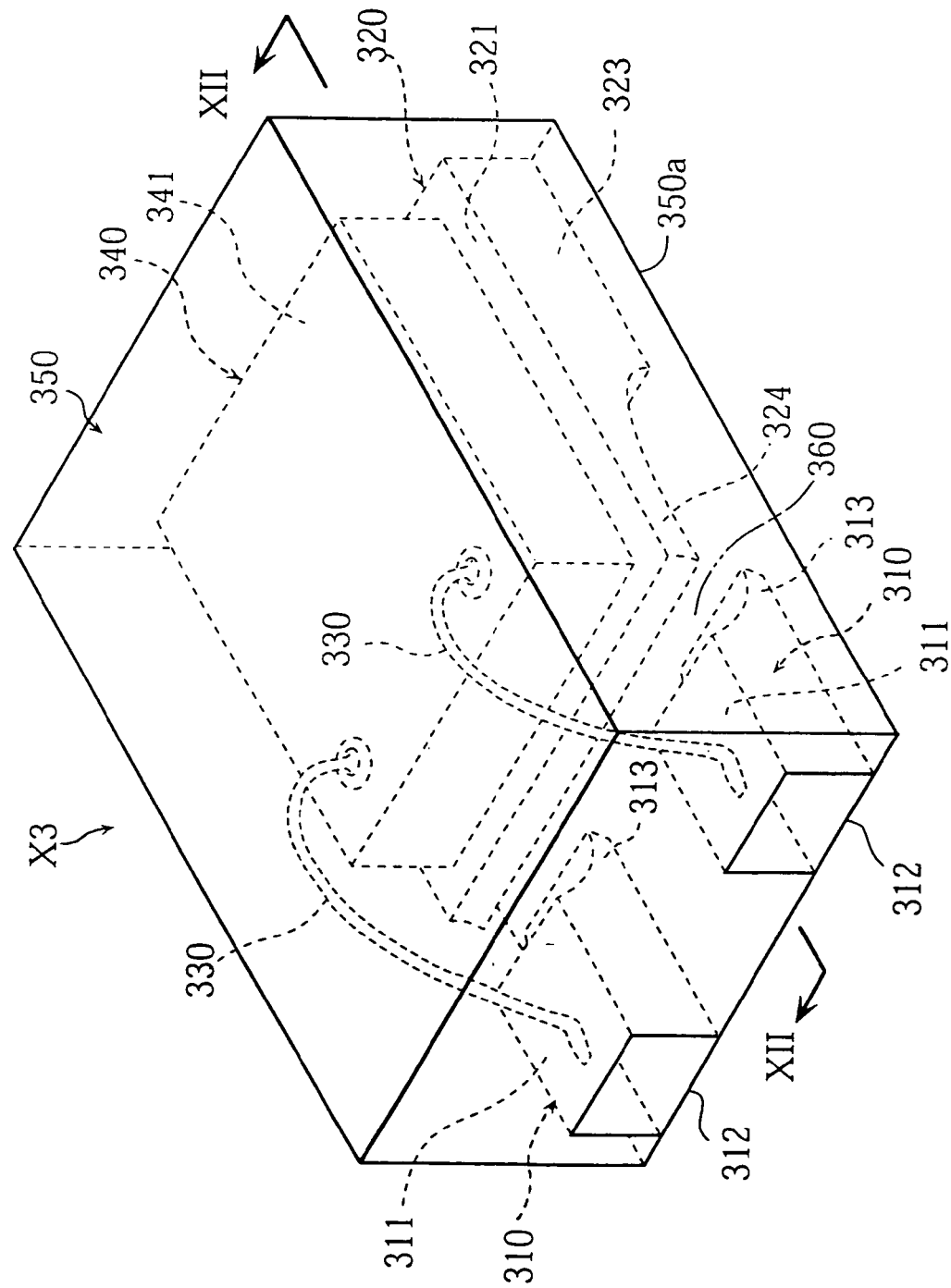
FIG. 10 is a perspective view of a semiconductor device according to a third embodiment of the present invention.
Figure 11:
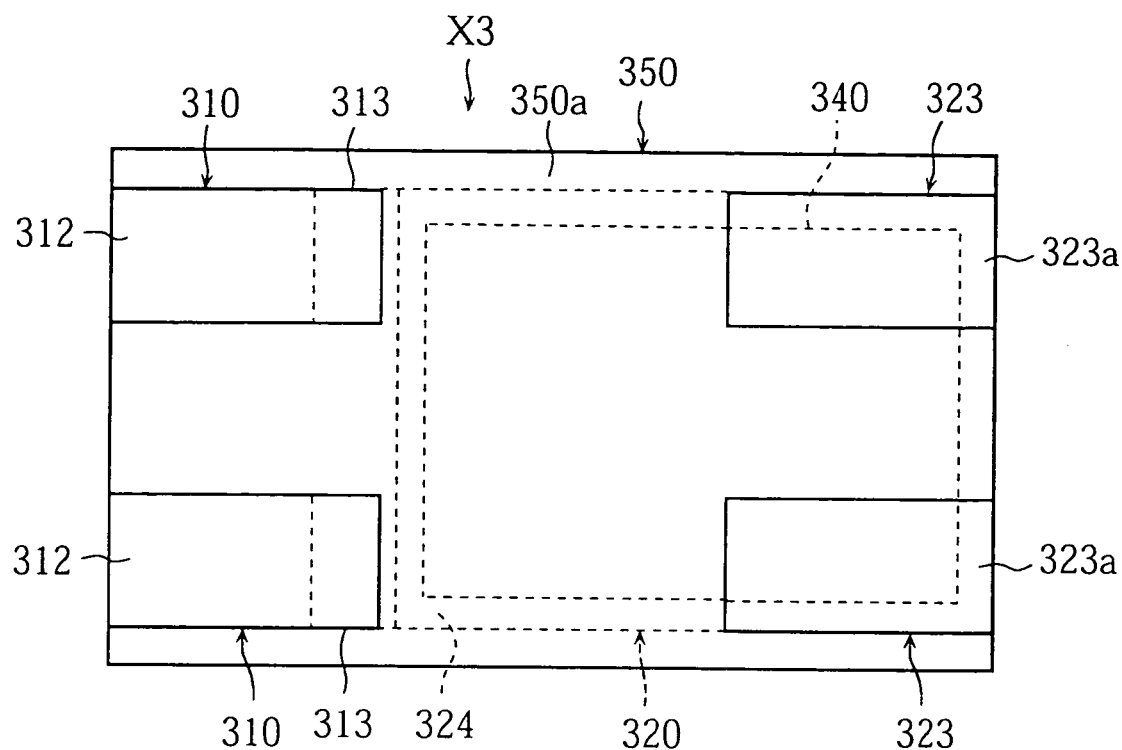
FIG. 11 is a bottom view of the semiconductor device in FIG. 10.
Figure 12:
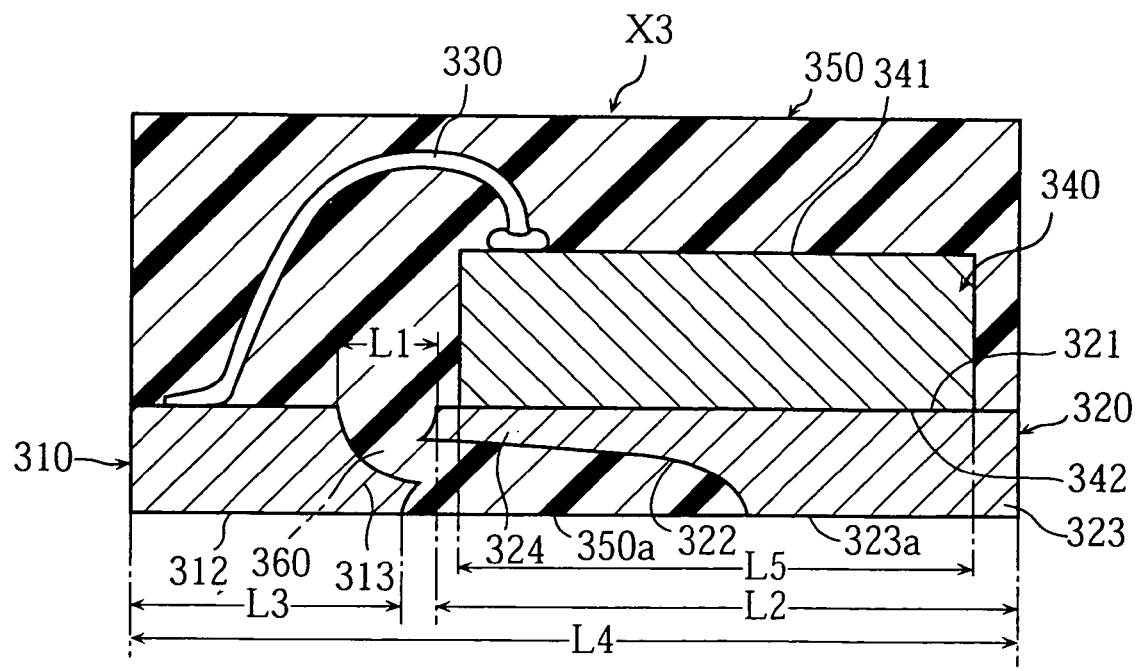
FIG. 12 is a sectional view taken in lines XII-XII in FIG. 10.

FIG. 10 through FIG. 12 show a semiconductor device X3 according to a third embodiment of the present invention. FIG. 10 is a perspective view of the semiconductor device X3. FIG. 11 is a bottom view of the semiconductor device X3. FIG. 12 is a sectional view taken in lines XII-XII in FIG. 10.

The semiconductor device X3 is of a surface-mountable wire type, and includes two first conductors 310, a second conductor 320, two wires 330, a semiconductor chip 340 and a resin package 350.

The semiconductor chip 340 is a semiconductor element such as a transistor, and has a first surface 341 and a second surface 342. The first surface 341 is formed with two first electrodes (not illustrated), whereas the second surface 342 is formed with one second electrode (not illustrated). The semiconductor chip 340 is bonded to a first surface 321 of the second conductor 320 via an electrically conductive adhesive, a metal paste and the like, providing electrical connection between the second electrode of the of the second surface 342 and the second conductor 320.

Each of the first conductors 310 has a first surface 311 and a first terminal surface 312 away therefrom. The first terminal surface 312 is exposed on a bottom surface 350a of the resin package 350 for contact with an external terminal. The first conductor 310 has a thin terminal portion 313 opposed by the second conductor 320, with a gap 360 in between. The thin terminal portion 313 is receded from the first surface 311, and thus made thin. Specifically, the first conductor 310 extends toward the second conductor 320 on the side of the first terminal surface 312. As clearly shown in FIG. 11, the two first conductors 310 are placed side by side, with their respective thin terminal portions 313 extending in a same direction.

The second conductor 320 has a flat first surface 321 and a second surface 322 away therefrom. The second surface 322 is provided with a pair of projections 323. Each of the projections 323 has a second terminal surface 323a which exposes on the resin package 350 for contact with an external terminal. The projections 323 are formed by means of half etching for example, performed to regions of the second surface 322 other than the regions to serve as the projections 323. The second conductor 320 has a thin terminal portion 324 opposed by the first conductors 310, with a gap 360 in between. The thin terminal portion 324 is receded from the second surface 322, and thus made thin. Specifically, the second conductor 320 extends toward the first conductors 310 on the side of the first surface 321. The first conductors 310 and the second conductor 320 have their respective two first terminal surfaces 312 and the two second terminal surfaces 323a being on a same plane.

Each of the wires 330 is made of a metal such as gold, and connects the first electrode (not illustrated) formed on the first surface 341 of the semiconductor chip 340 with the first conductor 310. Such a wiring can be made by using a conventional wire bonder.

The resin package 350 seals the first conductors 310, the second conductor 320, the wires 330, and the semiconductor chip 340 while exposing the two first terminal surfaces 312 and the two second terminal surfaces 323a. The resin package 350 is formed for example, of an epoxy resin by means of a transfer-molding method.

According to the semiconductor device X3, the first conductors 310 extend toward the second conductor 320 on the side of the first terminal surface 312 while receding from the second conductor 320 on the side of the first surface 311. The second conductor 320 extends toward the first conductors 310 on the side of the first surface 321 while receding from the first conductors 310 on the side of the second surface 322. Thus, it is possible to provide a large area of the first surface 321 in the second conductor 320 for mounting the semiconductor chip 340 while maintaining the distance L1 from the first conductors 310 to the second conductor 320 greater than a certain minimum value. In other words, it becomes possible to increase the distance L2 in FIG. 3. In addition, it becomes possible to increase the area or the distance L3 of the first terminal surface 312 which is for external contact. Therefore, the semiconductor device X3 of a given size, i.e. the semiconductor device X3 having its distance L4 of a given length, can now accommodate a larger semiconductor chip 340 than before on the second conductor 320 while allowing for standard dimensions for the first terminal surfaces 312 and the second terminal surfaces 323a. As understood from the above, according to the present embodiment, size limit (e.g. to the length L5) to the semiconductor chip 340 mountable on the second conductor 320 is reduced.

Figure 13:
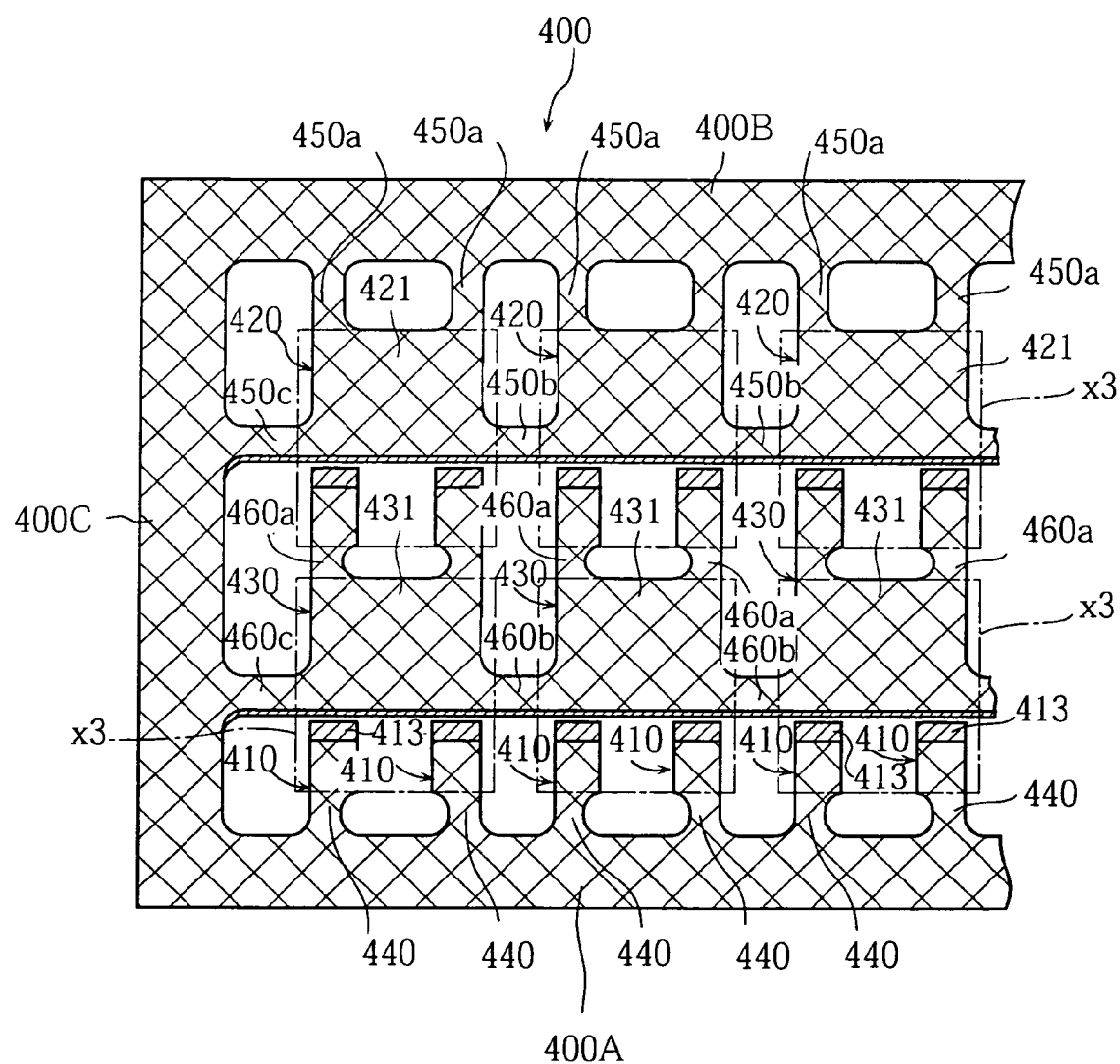
FIG. 13 is a fragmentary plan view of a lead frame used for making the semiconductor device in FIG. 10.
Figure 14:
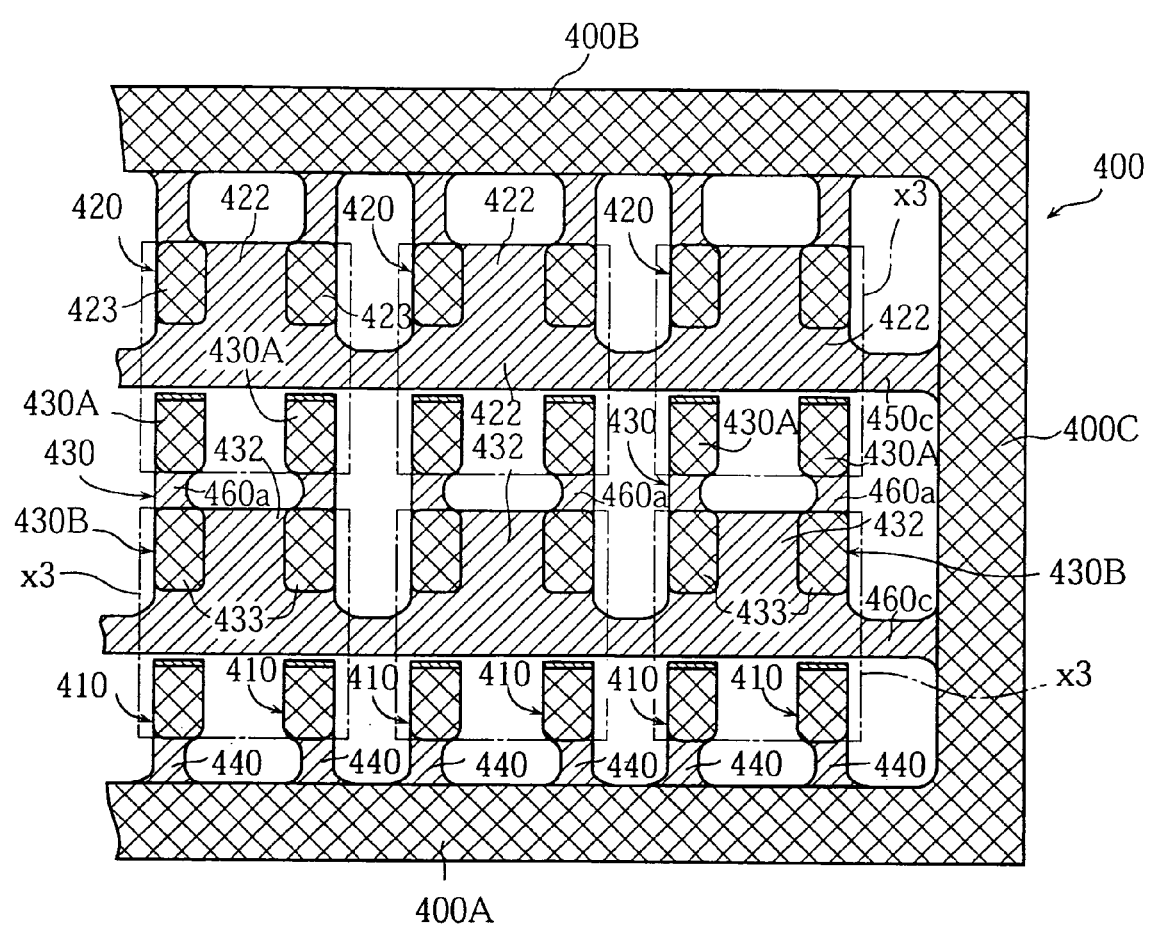
FIG. 14 is a fragmentary plan view of the lead frame in FIG. 13 viewed from the opposite side as in FIG. 13.

Reference is made now to FIG. 13 through FIG. 19 for describing a method of making the semiconductor device X3. The semiconductor device X3 is made from a lead frame 400 as shown in FIG. 13 and FIG. 14. The lead frame 400 includes two rows of semiconductor device formation areas x3, each shown surrounded by dashed lines in the figures. Each semiconductor device formation area x3 yields one semiconductor device X3. In FIG. 13 and FIG. 14, a crosshatched area indicates a portion of the lead frame 400 which is not etched, whereas a single-hatched area indicates a half-etched portion. A white portion of the lead frame 400 indicates a through hole formed by etching from both surfaces.

The lead frame 400 includes a pair of side members 400A, 400B and a pair of cross members 400C (only one is illustrated) connecting the side members together. The side members 400A, 400B and the cross members define a frame, in which there is formed a plurality of first regions 410, second regions 420 and third regions 430 to serve as the first conductors 310 and the second conductor 320 of the semiconductor device X3. The first regions 410 are along the side member 400A, extending from the side member 400A toward the side member 400B. The second regions 420 are along the side member 400B, extending from the side member 400B toward the side member 400A. Each of the third regions 430 has a portion corresponding to the first region 410 and a portion corresponding to the second region 420, and is between a pair of the first region 410 and the second region 420.

Each first region 410 as a whole is essentially the same as the first conductor 310. Each third region 430 is opposed by a pair of first regions 410. Each first region 410 has an end opposed by the third region 430, This end is half-etched from the surface shown in FIG. 13 to be a thin end 413. Each first region 410 is connected to the side member 400A via a bridge portion 440. The bridge portion 440 is thinner than the side member 400A and the first region 410.

Each second region 420 includes the flat first surface 421 shown in FIG. 13 and the second surface 422 formed with a pair of projections 423 shown in FIG. 14. The second region 420 as a whole is essentially the same as the second conductor 320 of the semiconductor device X3. The second region 420 is connected to the side member 400B via a pair of bridge portions 450a. Mutually adjacent second regions 420 are connected together by a bridge portion 450b. The second region 420 at an end of the row is connected to the cross member 400C via a bridge portion 450c. The bridge portions 450a, 450b, 450c are thinner than the side member 400B, the cross member 400C and the part of the second region 420 formed with the projections 423.

Each third region 430 includes two first portions 430A which correspond to the first region 410, and a second portion 430B which corresponds to the second region 420. A bridge portion 460a connects these two regions. Mutually adjacent third regions 430 are connected together via a bridge portion 460*b*. The third region 430 at an end of the row is connected to the cross member 400C via a bridge portion 460*c*. The third region 430 has the flat first surface 431 shown in FIG. 13 and the second surface 432 formed with two projections 433A shown in FIG. 14. The bridge portions 460*a*, 460*b*, 460*c* are thinner than the cross member 400C and the portion of the third region 430 formed with projections 433.

Figure 15A:
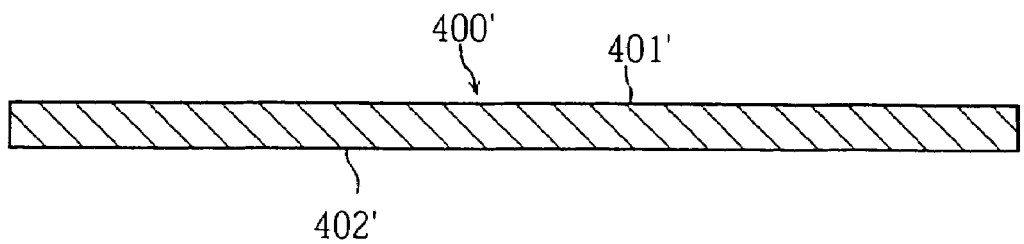
FIG. 15A-FIG. 15D show steps for making the lead frame in FIG. 13.
Figure 15B:
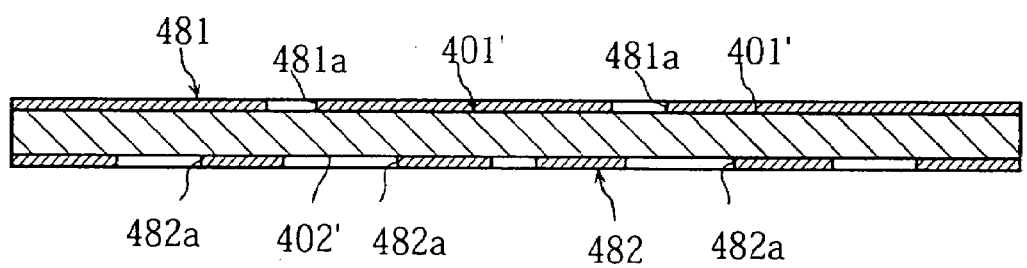

The lead frame 400 having such an arrangement is made through a series of steps shown in FIG. 15A through FIG. 15D. First, as shown in FIG. 15A, a metal plate 400' of e.g. copper or nickel has its upper surface 401' and back surface 402' formed with etching masks 481, 482 respectively. The etching masks 481, 482 are respectively formed with openings 481*a*, 482*a* correspondingly to regions to be etched. The etching masks 481, 482 are formed, for example, by first forming a photosensitive resin layer on each of the upper surface 401' and the back surface 402' of the metal plate 400', and then by forming the openings 481' 482' through photographic exposure and development processes.

Figure 15C:
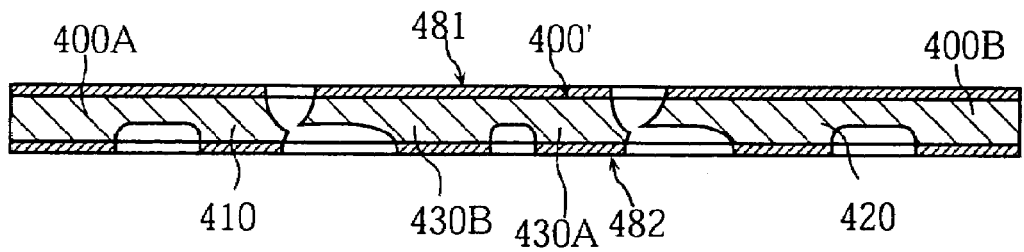
Figure 15D:
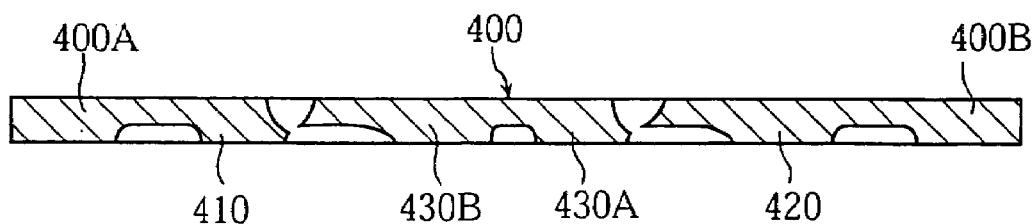

Next, the metal plate 400' formed with the etching masks 481, 482 is soaked into an etching solution capable of solving component materials of the metal plate 400'. In this process, as shown in FIG. 15C, regions of the metal plate 400' corresponding to the openings 481*a*, 482*a* are etched. The regions exposed from the openings 481*a*, 482*a* are half-etched to a predetermined depth. As a result, each region formed with the opening 481*a* and with the opening 482*a* right beneath is fully etched to be a through hole. Next, as shown in FIG. 15D, the etching masks 481, 482 are removed, to obtain the completed lead frame 400 that includes non-etched regions which used be covered by the etching masks 481, 482, regions which are half-etched from the upper surface 401', regions which are half-etched from the back surface 402', and regions which are now through holes.

The semiconductor device X3 is manufactured from the lead frame 400 thus made as above, through a series of steps shown in FIG. 16 through FIG. 19.

Figure 16:
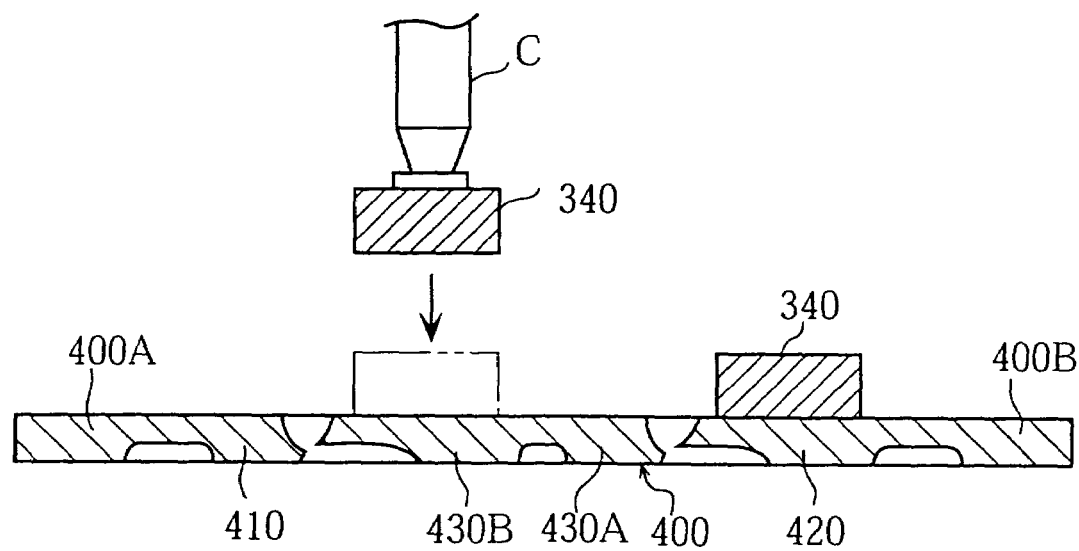
FIG. 16 shows a step of chip bonding according to a method of making the semiconductor device in FIG. 10.

First, as shown in FIG. 16, a semiconductor chip 340 is mounted on the second region 420 and the second portion 430B of the third region 430, of the lead frame 400, i.e. on the part to serve later as the second conductor 320. The second region 420 and the third region 430 are applied in advance with electrically conductive adhesive or metal paste. The semiconductor chip 430 is sucked by a suction collet of a conventional chip mounter, and mounted onto the regions applied with e.g. the adhesive. Then, the adhesive is allowed to set, to bond the semiconductor chip 340 to the second region 420 and the third region 430.

Figure 17:
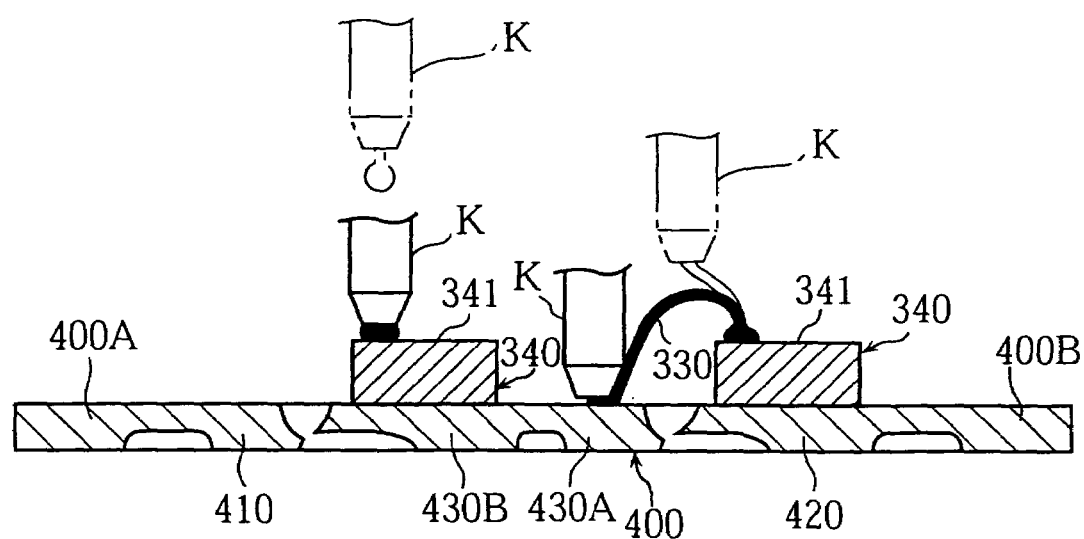
FIG. 17 shows a step of wire bonding according to the method of making the semiconductor device in FIG. 10.

Next, as shown in FIG. 17, wire bonding using a wire 330 is performed from the first electrode (not shown) formed in the first surface 341 of the semiconductor chip 340 to the first region 410 or the first portion 430A of the third region 430 in the lead frame 400, i.e. to the part to serve later as the first conductor 310. The bonding with the wire 330 can be performed with a conventional wire bonder. The bonding with the wire 330 includes a first bonding performed to the first surface 341 of the semiconductor chip 340 and a second bonding performed to the first region 410 or the first portion 430A. In the first bonding, a tip of the wire 330 is extended out of a capillary K of the wire bonder, then melted by arc heating, hydrogen flame, and so on, and then pressed onto the first electrode (not illustrated) of the semiconductor chip 340. In the second bonding, the capillary K is moved toward the first region 410 or the first portion 430A, with the wire 330 being pulled out of the capillary K. Then, while the tip of the capillary K is pressed onto the second bonding location, the capillary K is slid to cut the wire 330.

Figure 18:
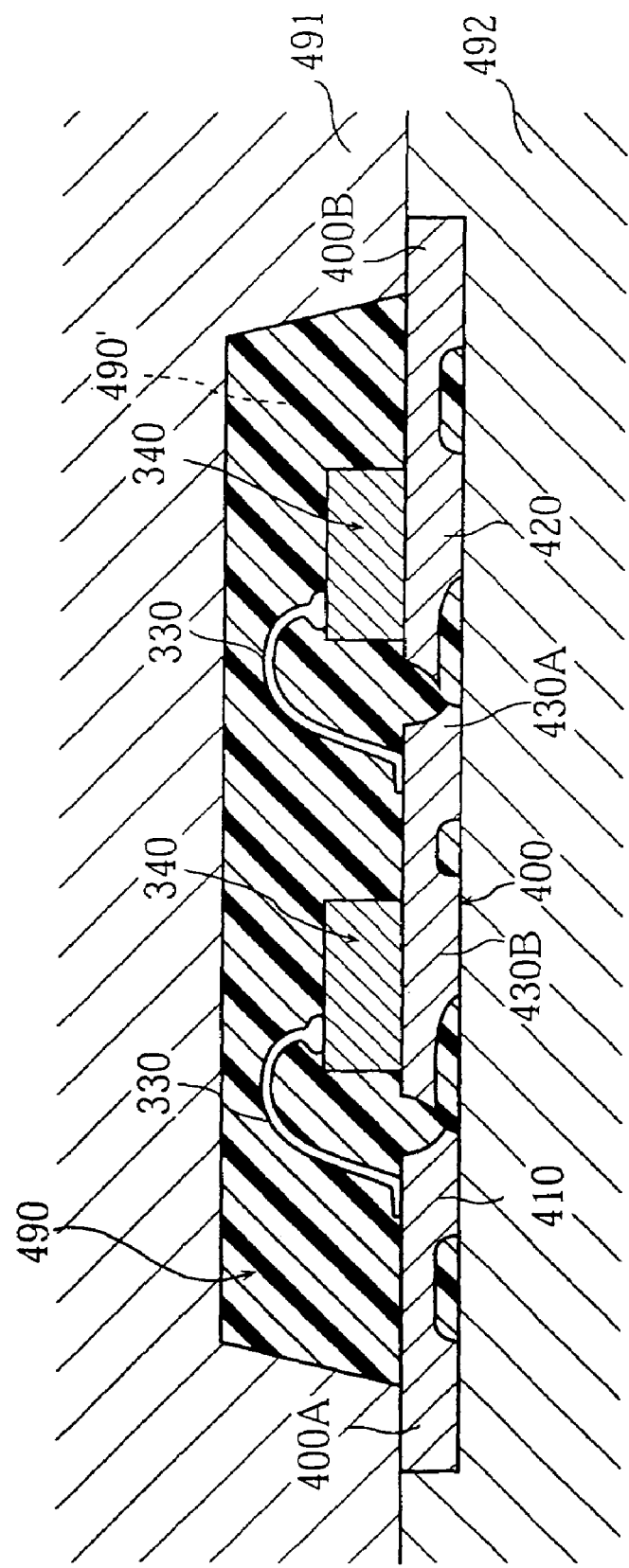
FIG. 18 shows a step of resin molding according to the method of making the semiconductor device in FIG. 10.

Next, as shown in FIG. 18, a resin package 490 is formed to seal the semiconductor chips 340, wires 330 as well as the first region 410 through the third region 430. The resin package 490 is formed for an entire region of a plurality of the semiconductor device formation area x3, by using a pair of metal mold halves 491, 492. Specifically, for example, the mold halves 491, 492 are closed to form a cavity 490', in which the semiconductor chips 340 and the wires 330 are accommodated, with the lead frame 400 sandwiched between the mold halves. Next, a thermosetting resin such as an epoxy resin is injected into the cavity 490', and the resin is allowed to set thermally. Then, the mold halves are separated, thereby obtaining the resin package 490. According to the present invention, a plurality of the resin packages 490 may be formed individually, by using a mold which provides an individual cavity to each of the semiconductor device formation area x3 when the mold is closed.

Figure 19:
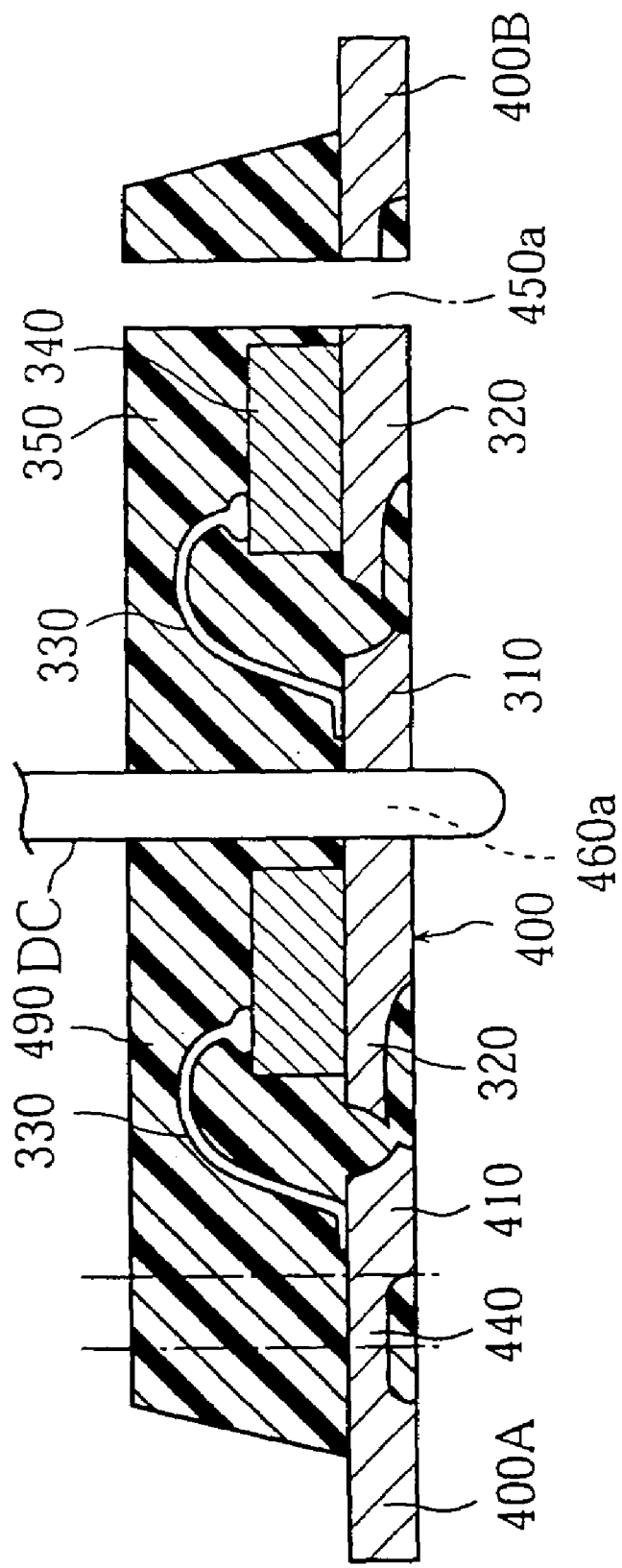
FIG. 19 shows a step of cutting according to the method of making the semiconductor device in FIG. 10.

Next, as shown in FIG. 19, along an outer perimeter of each of the semiconductor device formation area x3 in the lead frame 400, cutting is made, by using a diamond cutter DC for example, to the resin package 490, the bridge portions 440, 450*a*-450*c*, and 460*a*-460*c*. As a result, single-piece semiconductor devices X3 as shown in FIG. 10 through FIG. 12 are obtained. It should be noted here that the semiconductor device X3 taken as an example for describing the present embodiment is a four-terminal semiconductor device. However, the present invention is applicable not only to the four-terminal type but also other types of semiconductor devices.

Figure 20:
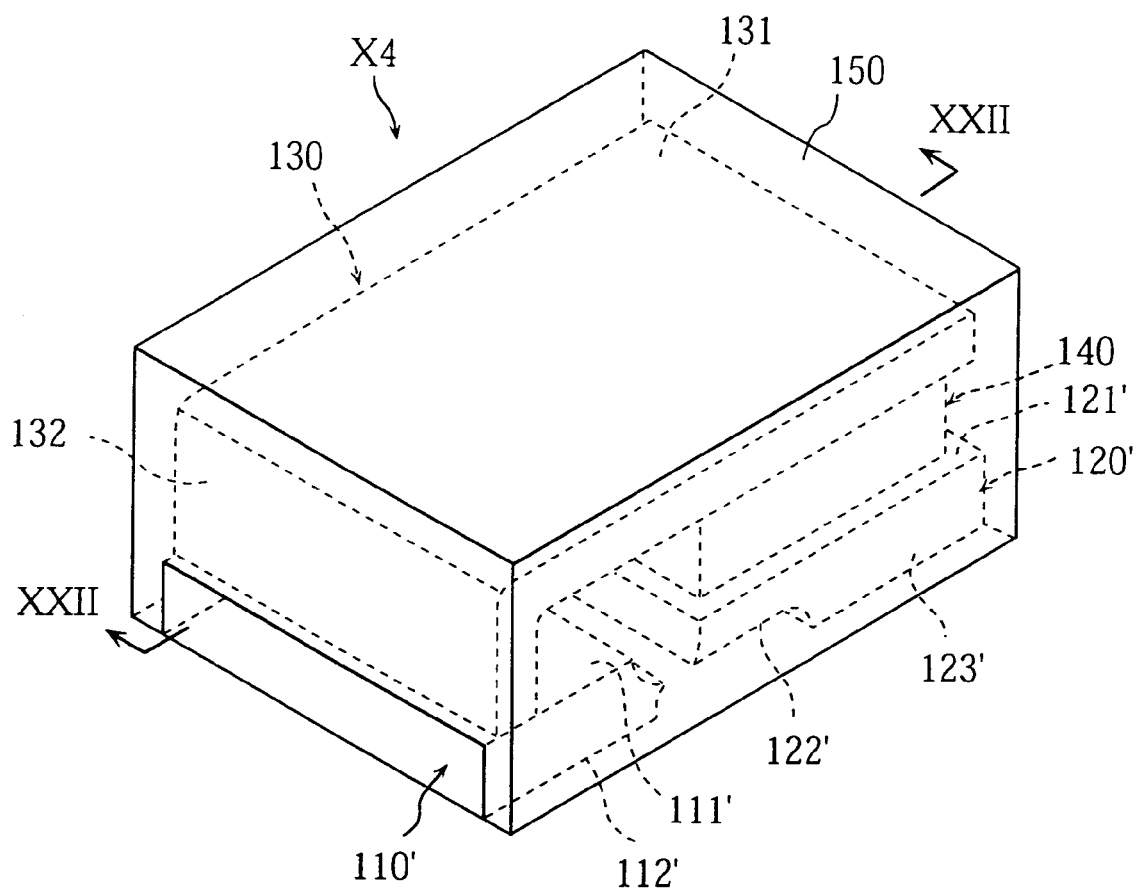
FIG. 20 is a perspective view of a semiconductor device according to a fourth embodiment of the present invention.
Figure 21:
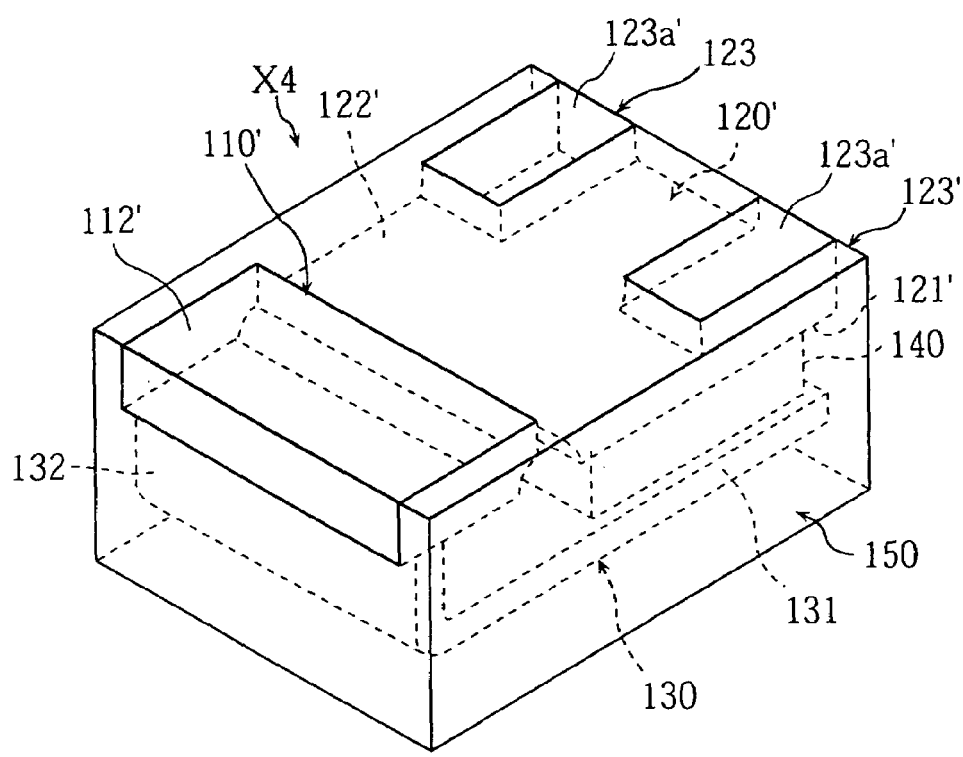
FIG. 21 is a perspective view of the semiconductor device in FIG. 20 viewed from the opposite side as in FIG. 20.
Figure 22:
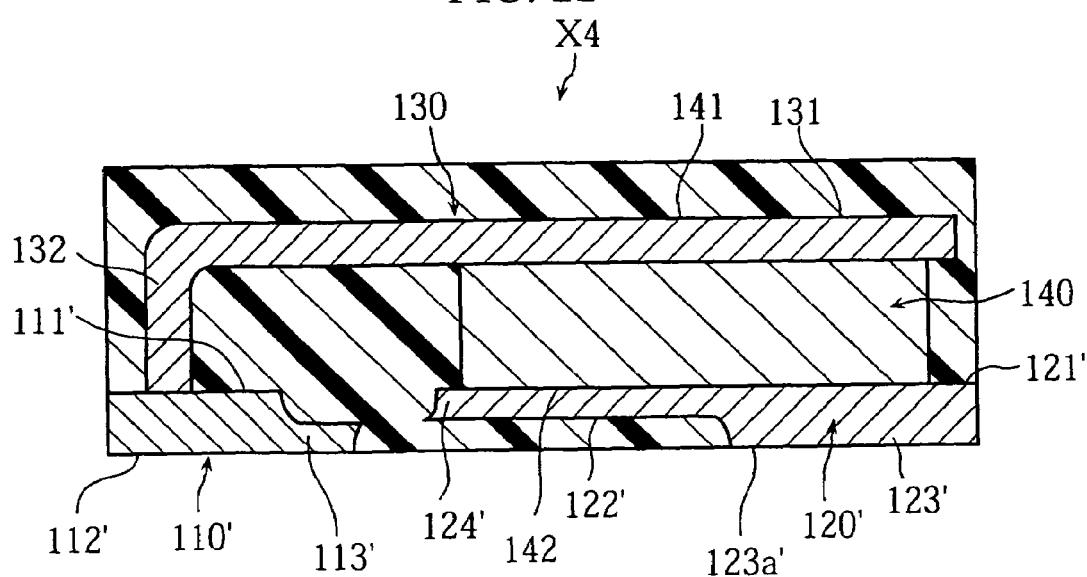
FIG. 22 is a sectional view taken in lines XXII-XXII in FIG. 20.

FIG. 20 through FIG. 22 show a semiconductor device X4 according to a fourth embodiment of the present invention. FIG. 20 is a perspective view of the semiconductor device X4. FIG. 21 is a perspective view of the semiconductor device X4 viewed from the opposite side as in FIG. 20. FIG. 22 is a sectional view taken in lines XXII-XXII in FIG. 20. The semiconductor device X4 has a first conductor 110' a second conductor 120', a third conductor 130, a semiconductor chip 140, and a resin package 150. The semiconductor device X4 is the same as the above-described semiconductor device X1 in that the third bent conductor 130 connects the first conductor 110' with a first electrode 110' (not illustrated) formed on a first surface 141 of the semiconductor chip 140. However, the semiconductor device X4 differs from the semiconductor device X1 in the arrangement made for the first conductor 110' and the second conductor 120', as well as how the semiconductor chip 140 is mounted.

Specifically, the first conductor 110' has a flat first surface 111' and a first terminal surface 112' away therefrom. The first terminal surface 112' exposes on a bottom surface 150*a* of the resin package 150 for contact with an external terminal. As in the first conductor 310 according to the third embodiment described above, the first conductor 110' has a thin terminal portion 113' which is opposed by a second conductor 120', with a gap 160' in between. The thin terminal portion 113' is receded from the first surface 111', thereby made thin. In other words, the first conductor 110' extends toward the second conductor 120' on the side of the first terminal surface 112'.

The second conductor 120' has a flat first surface 121' and a second surface 122' away therefrom. The second surface 122' is provided with a pair of projections 123'. Each of the projections 123' has a second terminal surface 123*a'* which exposes on the bottom surface 150*a* of the resin package 150 for contact with an external terminal. The projections 123' are formed by means of half etching for example, performed to regions of the second surface 122 other than the regions to serve as the projections 123'. As in the second conductor 320 according to the third embodiment described above, the second conductor 120' has a thin terminal portion 124' which is opposed to the first conductor 110', with a gap 160' in between. The thin terminal portion 124' is receded from the second surface 122', thereby made thin. In other words, the second conductor 120' extends towards the first conductor 110' on the side of the first terminal surface 121'. The first conductor 110' and the second conductor 120' have their respective first terminal surface 112' and the two second terminal surfaces 123' being on a same plane.

The semiconductor chip 140 according to the present embodiment is a bear chip such as a diode, and mounted on the second conductor 120. Other arrangements for the semiconductor chip 140 are the same as described above for the first embodiment.

According to the semiconductor device X4, the first conductor 110' extends toward the second conductor 120' on the side of the first terminal surface 112' while receding from the second conductor 120' on the side of the first surface 111'. The second conductor 120' extends toward the first conductor 110' on the side of the first surface 121' while receding from the first conductor 110' on the side of the second surface 122'. Thus, it is possible to provide a large area of the first surface 121 in the second conductor 120' where the semiconductor chip 140 is mounted, while maintaining a certain sufficient distance between the first conductor 110' and the second conductor 120'. In addition, it becomes possible to increase the area of the first terminal surface 112' which is for external contact. Therefore, the semiconductor device X4 of a given size can now accommodate a larger semiconductor chip 140 than before on the second conductor 120', while allowing for standard dimension for the first terminal surface 112' and the second terminal surface 123'. As understood from the above, according to the present embodiment, size limit to the semiconductor chip 140 mountable on the second conductor 120' is reduced.

Further, the semiconductor device X4, which has its first surface 141 of the semiconductor chip 140 covered entirely by the base portion 131 of the third conductor 130, has a superior heat radiation and protection against noise interference. Further, the semiconductor device X4 has the same third conductor 130 as in the first embodiment. Therefore, the same benefit can be achieved as described for the third conductor 130 in the first embodiment. The semiconductor device according to the present embodiment can also be made as a four-terminal device, or further, may be provided with two third conductors or more than three third conductors if need be.

Figure 23:
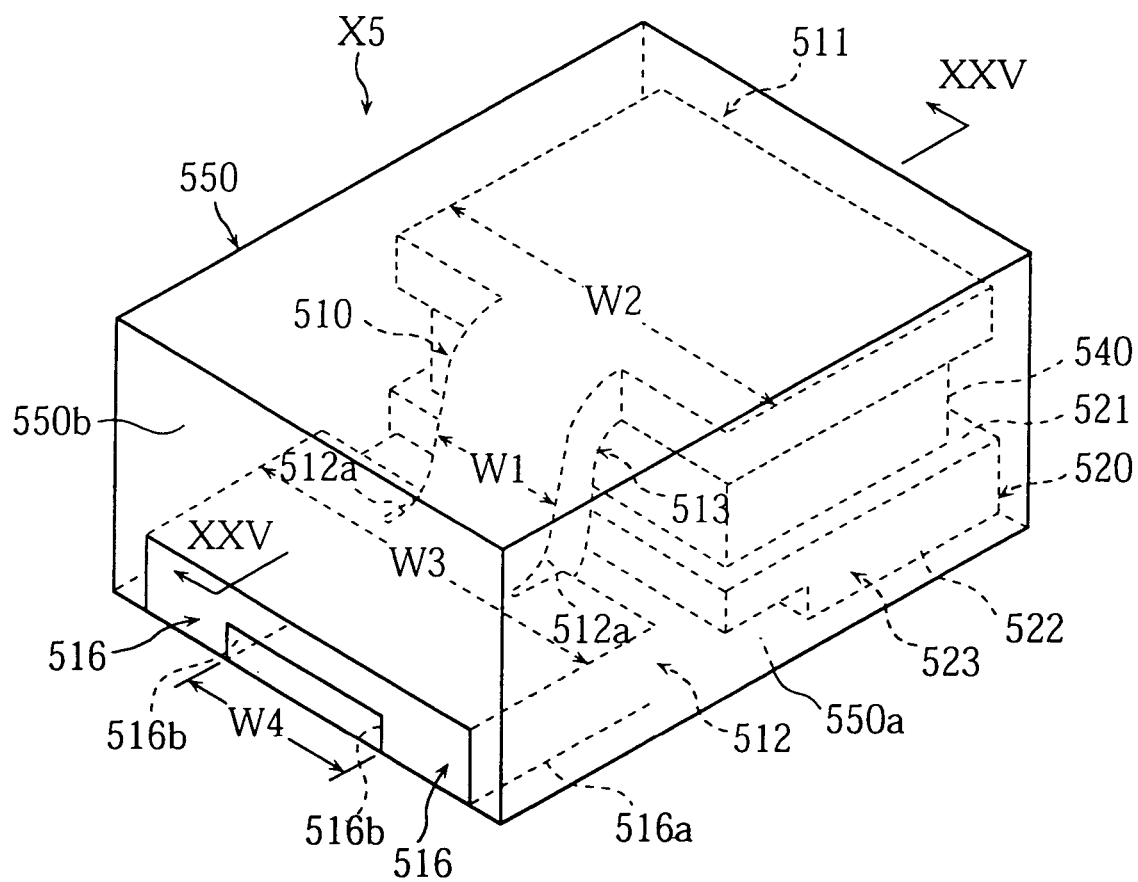
FIG. 23 is a perspective view of a semiconductor device according to a fifth embodiment of the present invention.
Figure 24:
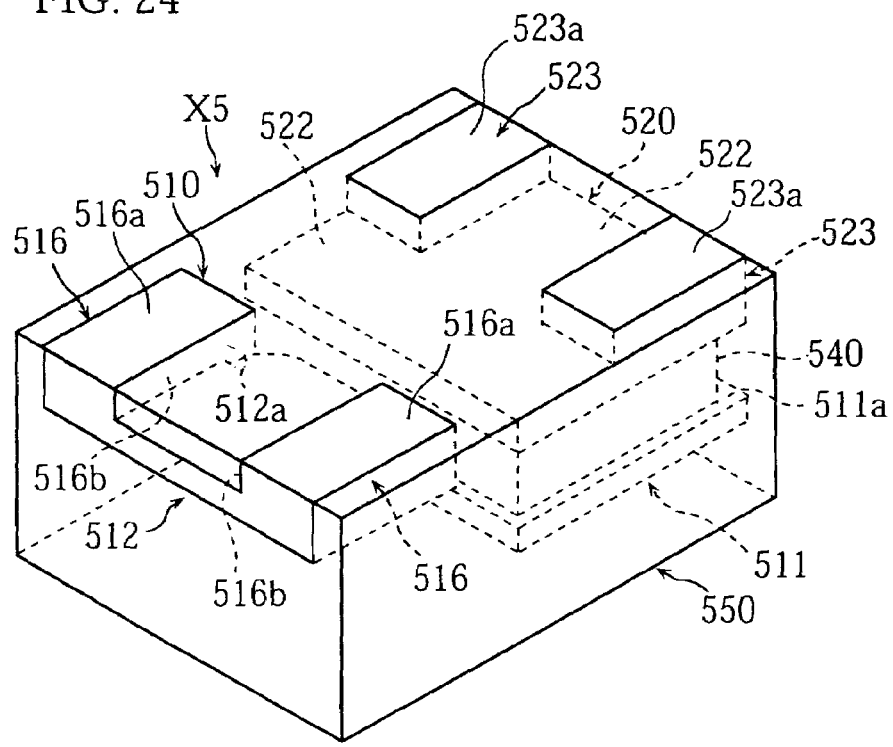
FIG. 24 is a perspective view of the semiconductor device in FIG. 23 viewed from the opposite side as in FIG. 23.
Figure 25:
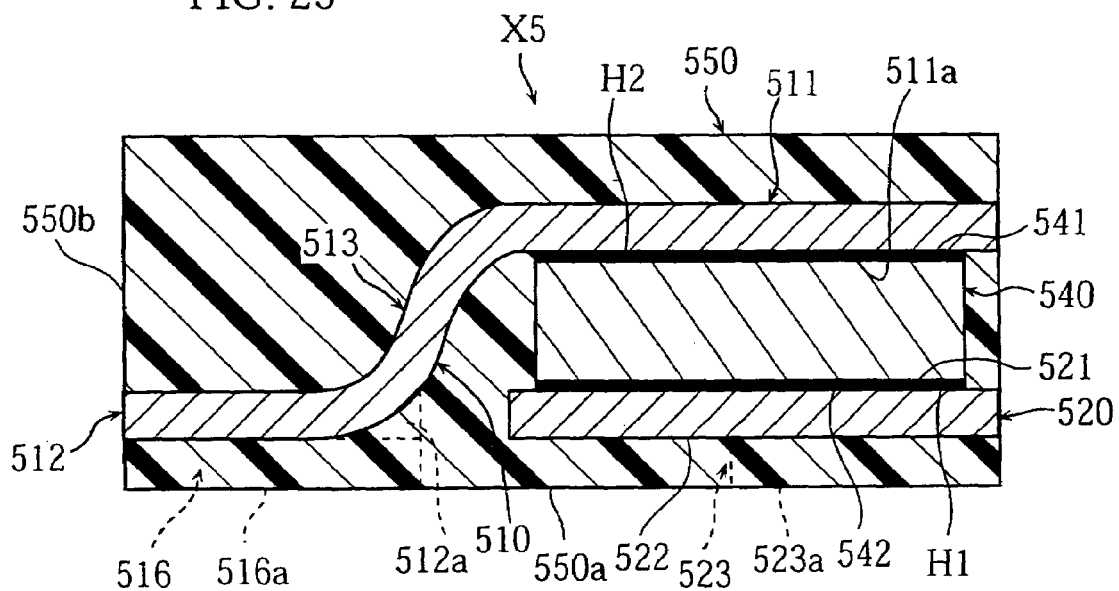
FIG. 25 is a sectional view taken in lines XXV-XXV in FIG. 23.

FIG. 23 through FIG. 25 show a semiconductor chip X5 according to a fifth embodiment of the present invention. FIG. 23 is a perspective view of the semiconductor device X5. FIG. 24 is a perspective view of the semiconductor device X5 viewed from the opposite side as in FIG. 23. FIG. 25 is a sectional view taken in lines XXV-XXV in FIG. 23.

The semiconductor device X5 is of a surface-mountable wireless type, and includes a first conductor 510, a second conductor 520, a semiconductor chip 540 and a resin package 550.

The semiconductor chip 540 is a bear chip such as a diode, and has a first surface 541 and a second surface 542. The first surface 541 and the second surface 542 are formed respectively with a first electrode (not illustrated) and a second electrode (not illustrated).

The second conductor 520 has a flat first surface 521 and a second surface 522 away therefrom. The second surface 522 is provided with a pair of projections 523. Each of the projections 523 has a second terminal surface 523a which exposes on the bottom surface 550a of the resin package 550 for contact with an external terminal. Such projections 523 are formed by means of half etching for example, performed to regions of the second surfaces 522 of the second conductor 520 other than the regions to serve as the projections 523. The second conductor 520 is bonded to the semiconductor chip 540, via e.g. solder H, whereby the second electrode provided on the second surface 542 is electrically connected with the second conductor 520.

The first conductor 510 has a bent structure, including a first portion 511, a second portion 512 and the third portion 513.

The first portion 511 is bonded to the first surface 541, covering entirely the first surface 541 of the semiconductor chip 540. The first portion 511 has an inner surface 511a, which is bonded with e.g. solder to the first electrode provided in the first surface 541 of the semiconductor chip 540. Therefore, the semiconductor chip 540 is sandwiched between the second conductor 520 and the first portion 511.

The second portion 512 has a first surface 514 and a second surface 515 away therefrom. The second surface 515 has two ends provided with a pair of projections 516. Each of the projections 516 has a first terminal surface 516a which exposes on a bottom surface 550a of the resin package 550 for contact with an external terminal. The projections 516 can be formed through half etching as are the projections 523 of the second conductor 520. The first conductor 510 and the second conductor 520 are spaced by a predetermined distance, with their respective two first terminal surfaces 516a and the two second terminal surfaces 523a on a same plane.

The third portion 513 bridges the first portion 511 and the second portion 512. As shown in FIG. 25, the second portion 512 is lower than the first portion 511, and therefore the third portion 513 runs vertically as in the figure, i.e. thicknesswise of the resin package 550. At a border region between the second portion 512 and the third portion 513, cutouts 512a extend inwardly of the second portion 512. By using these cutouts 512a, the third portion 513 is raised from the second portion 512.

According to such an arrangement, as will be understood clearly from FIG. 25, the border region (bent portion) between the second portion 512 and the third portion 513, or in effect the entire third portion 513, can now be disposed more closely to a side surface 550b of the resin package 550. This enables to provide an increased space for the semiconductor chip 540 within the semiconductor device X5. As a result, it becomes possible to reduce size limit to the mountable semiconductor chip 540, or to reduce the size of the semiconductor device X5.

The third portion 513 has a thickness which is smaller than the thickness of the portion of the second portion 512 formed with the projections 516, and is equal to the thickness of the portion between the projection 516 of the second portion 512, as well as to the thickness of the first portion 511. As is clearly shown in FIG. 1, the third portion 513 has a width W1, which is smaller than a width W2 of the first portion 511 and a width W3 of the second portion 512, and is smaller than a distance W4 between the pair of opposed surfaces in the pair of projections 516, by as much as the cutouts 512a.

The resin package 550 seals the first conductor 510, the second conductor 520 and the semiconductor chip 540 while exposing the two first terminal surfaces 516a and the two second terminal surfaces 523a. The resin package 550 is formed for example of an epoxy resin by means of a transfer-molding method.

Figure 26:
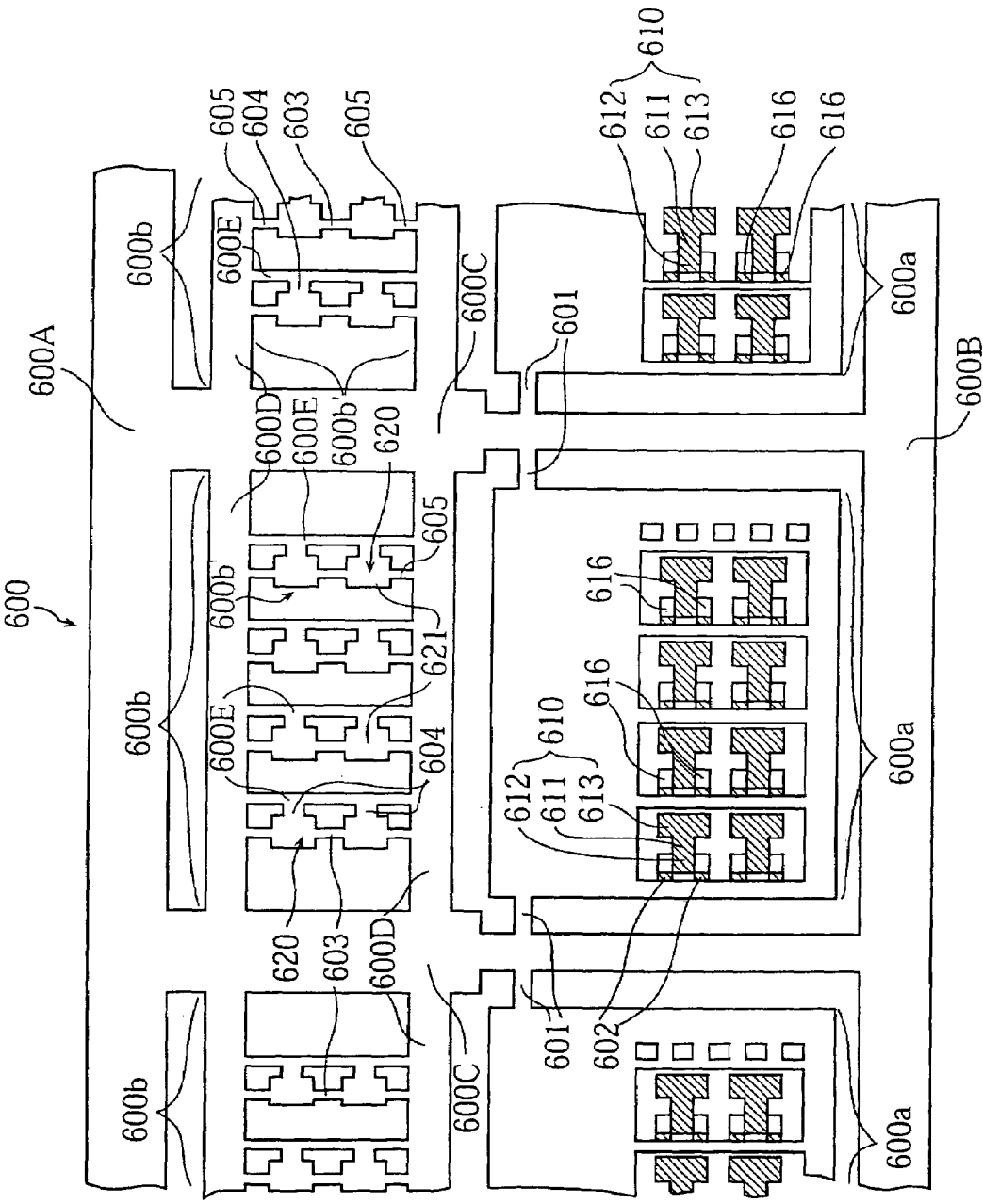
FIG. 26 is a fragmentary plan view of a lead frame used for making the semiconductor device in FIG. 23.
Figure 27:
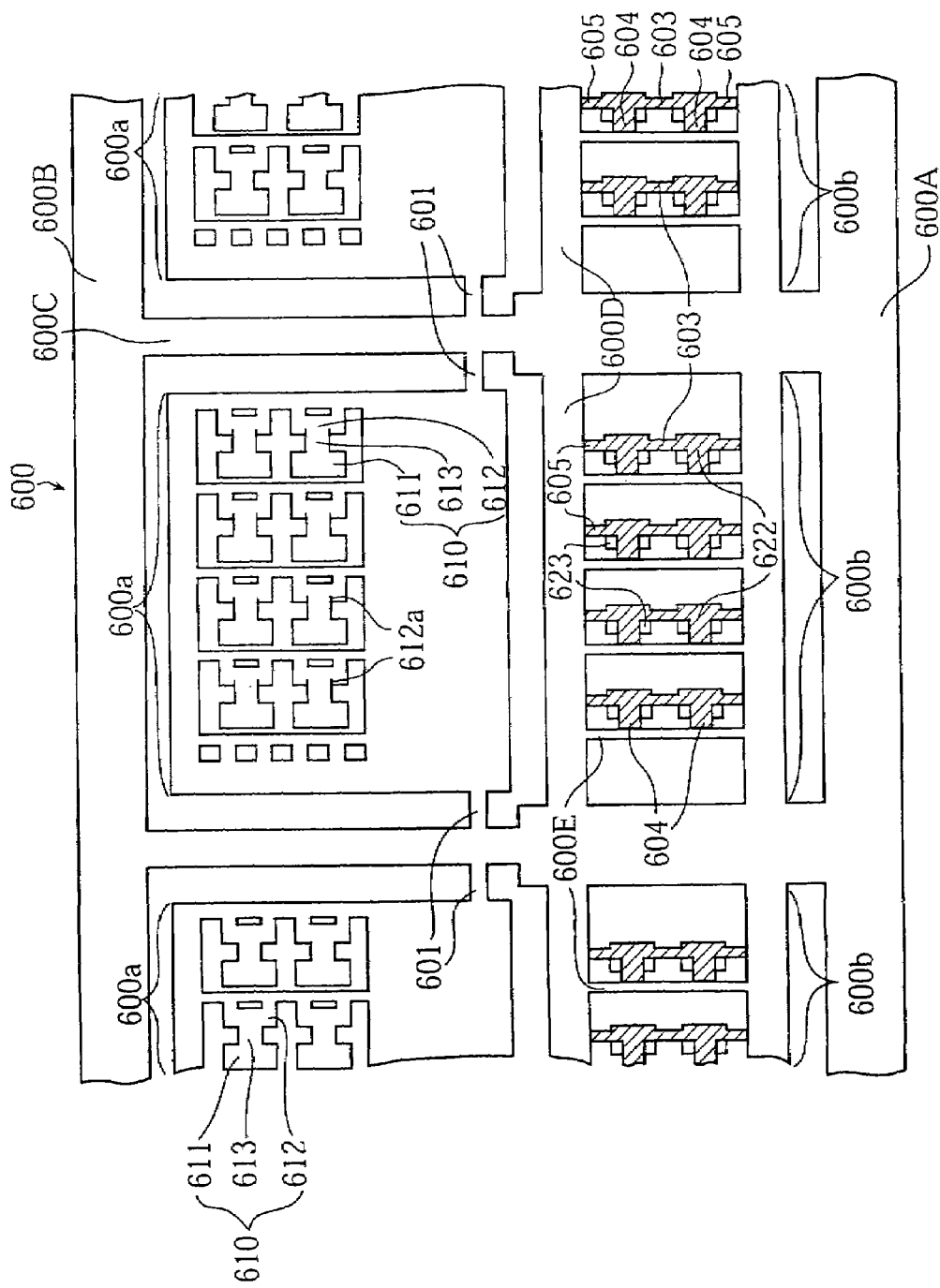
FIG. 27 is a fragmentary plan view of the lead frame in FIG. 26 viewed from the opposite side as in FIG. 26.

Reference is made now to FIG. 26 through FIG. 33 for describing a method of making the semiconductor device X5. The semiconductor device X5 is made from a lead frame 600 as shown in FIG. 26 and FIG. 27. A single-hatched area in FIG. 26 and FIG. 27 indicates a half-etched portion.

The lead frame 600 includes a pair of side members 600A, 600B and a plurality of cross members 600C connecting the side members together. The side members 600A, 600B and two cross members define a single frame, in which there is formed a first region 600a and a second region 600b. A plurality of the first regions 600a are along the side member 600A, whereas a plurality of the second regions 600b are along the side member 600B.

The first region 600a is connected to its adjacent cross members 600C via respective supporting bars 601, being pivotable around the supporting bars 601 to overlap with a corresponding second region 600b. The first region 600a is provided with a plurality of first conductor lands 610 each to serve later as the first conductor 510 of the semiconductor device X5. Layout of the first conductor lands 610 corresponds to layout of second conductor lands 620 to be described later.

Each of the first conductor lands 610, which includes a first portion 611, a second portion 612 and a third portion 613 connecting them, is supported within the first region 600a via bridge portions 602 which connect to the second portion 612. The first portion 611, an intermediate portion of the second portion 612, the third portion 613 and the bridge portions 602 have a thickness made thinner by means of half-etching than two end portions of the second portion 612. As a result, as shown in FIG. 26, the two ends of the second portion 612 have respective projections 616. In a border region between the second portion 612 and the third portion 613, along inward sides of the bases of the projections 616, a pair of cutouts 612a extends in a direction away from the direction in which the third portion 613 extends. This pair of cutouts 612a will serve as the pair of cutouts 512a in the semiconductor device X5. The third portion 613 has a width smaller than a width of the first portion 611 and of the second portion 612, and further, smaller than the distance between the two projections 616 due to the cutouts made on each inward side of the bases of the pair of projections 616. According to the present invention, the two cutouts 612a may be formed more inwardly, closer to a widthwise center of the second portion 612 than shown in FIG. 27, thereby reducing further the width of the third portion 613 defined by the distance between the two cutouts 612a. It should be noted here that the term width of various parts of the first conductor land 610 refers to a vertical dimension as viewed in FIG. 26 and FIG. 27, of the relevant part.

Each of the second regions 600b is defined by two mutually adjacent cross members 600C and a pair of sub side members 600D connecting these cross members. The second region 600b is divided into a plurality of sub regions 600b' by cross bars 600E connecting the pair of sub side members 600D. Each of the sub regions 600b' is provided with two second conductor lands 620. The two conductor lands 620 are connected to each other by a bridge portion 603. Each of the second conductor lands 620 is connected to the cross bar 600E via a bridge portion 604, and to the sub side member 600D via a bridge portion 605. The second conductor land 620 will serve later as the second conductor 520 of the semiconductor device X5.

Each of the second conductor lands 620 has a flat first surface 621 as shown in FIG. 26 and a second surface 622 away therefrom, as shown in FIG. 27. The second surface 622 is provided with a pair of projections 623. Each of the projections 623 is formed by means of half etching for example, performed to regions other than the regions to serve as the projections 623.

The lead frame 600 is applied in advance with electrically conductive material, at its positions where connection will be made later with electrodes (not illustrated) of the semiconductor chip 540. More specifically, solder paste for example is printed by means of mask and squeeze at the first portion 611 of the first conductor land 610, and at the second conductor land 620.

Figure 28:
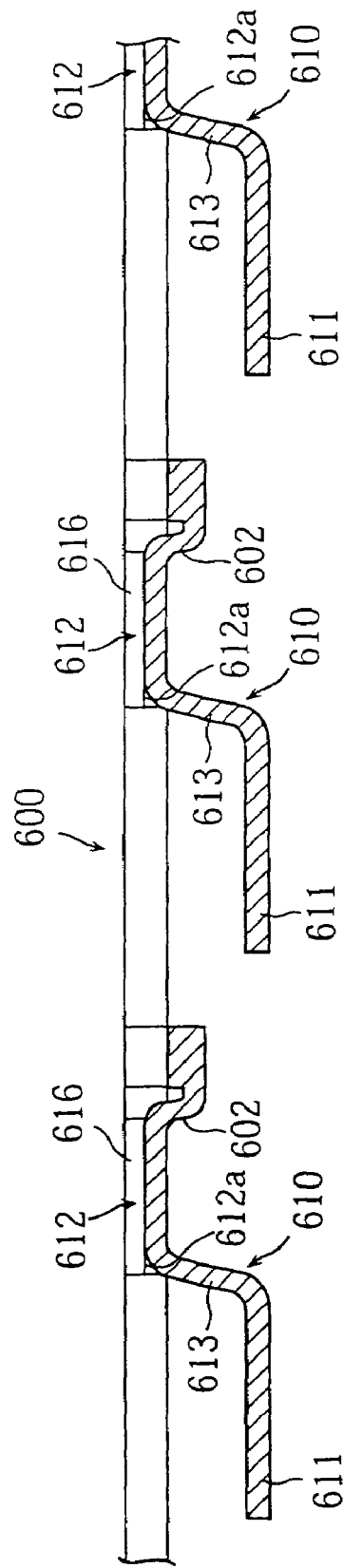
FIG. 28 is a fragmentary sectional view as after a step of shape formation performed to the lead frame in FIG. 26.

Next, forming is performed to each first conductor land 610. The forming is achieved, for example, through a pressing operation using a metal die. According to the present embodiment, each of the first portion 611 and the second portion 612 is bent away from each other, at about 90 degrees with respect to the third portion 613, respectively at a border region between the first portion 611 and the third portion 613 and at a border region between the second portion 612 and the third portion 613. Then, as shown in FIG. 28, the first portion 611 is set lower than the second portion 612.

The first conductor land 610 has the cutouts 612a, and the third portion 613 is thinner than the two end portions of the second portion 612. For this reason, bending of the third portion 613 as well as the setting of the first portion 611 with respect to the second portion 612 can be made easily and reliably.

Figure 29:
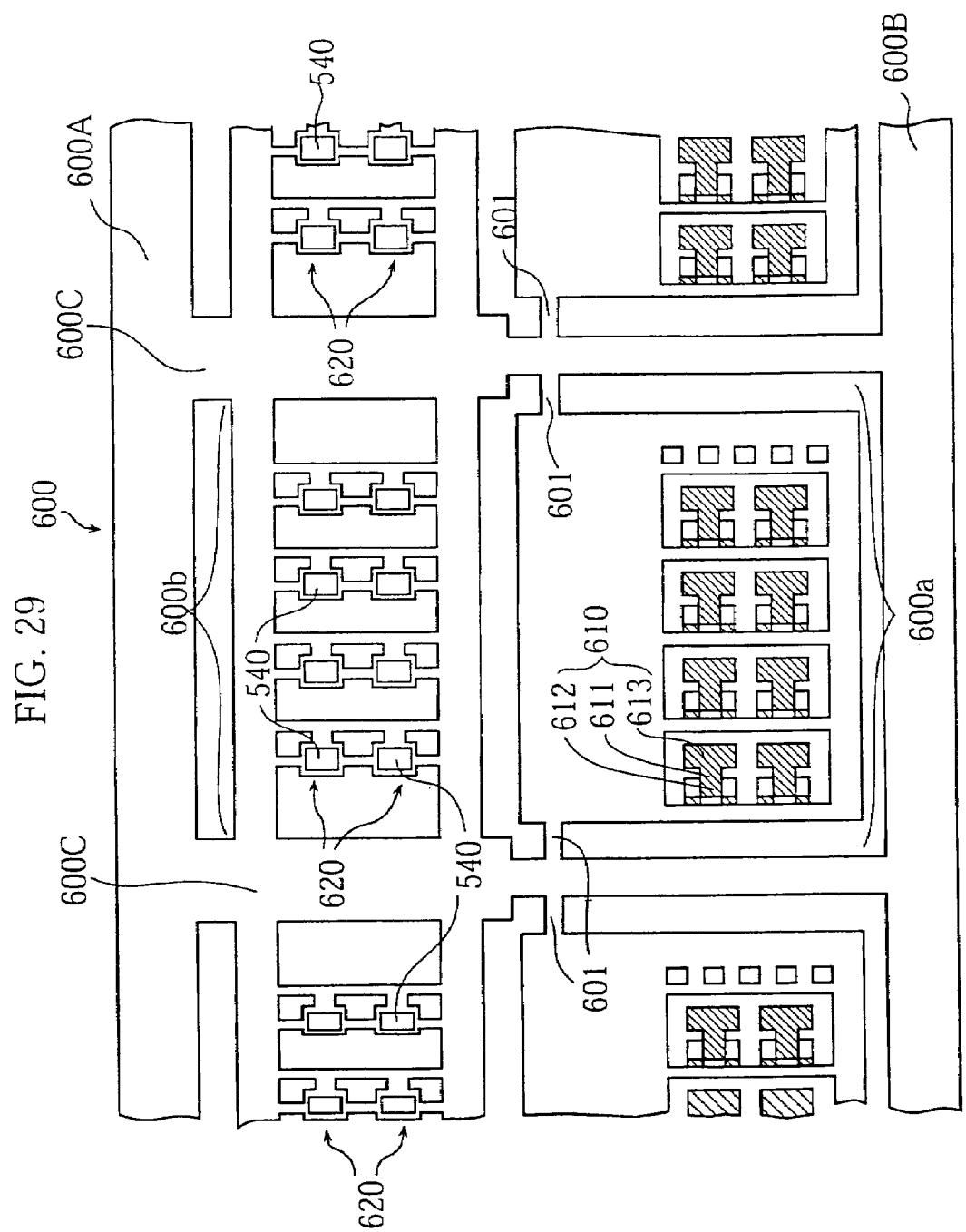
FIG. 29 is a fragmentary plan view as after a step of placing a semiconductor chip on the lead frame in FIG. 26.

Next, as shown in FIG. 29, a semiconductor chip 540 is mounted on the second conductor land 620. The mounting of the semiconductor chip 540 can be performed by a known chip mounter for example.

Figure 30:
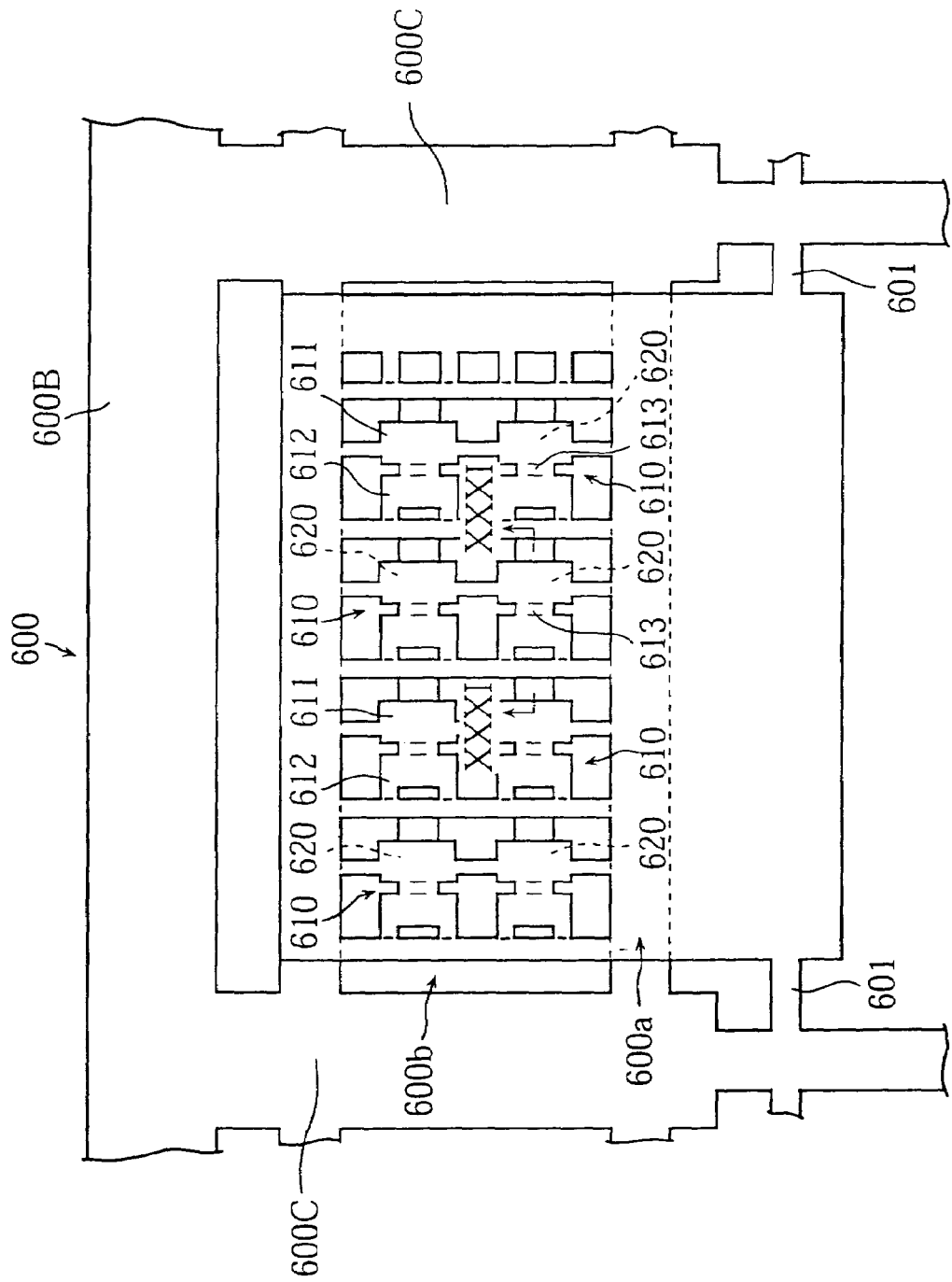
FIG. 30 shows a state in which a first region and a second region of the lead frame in FIG. 26 are overlapped with each other.
Figure 31:
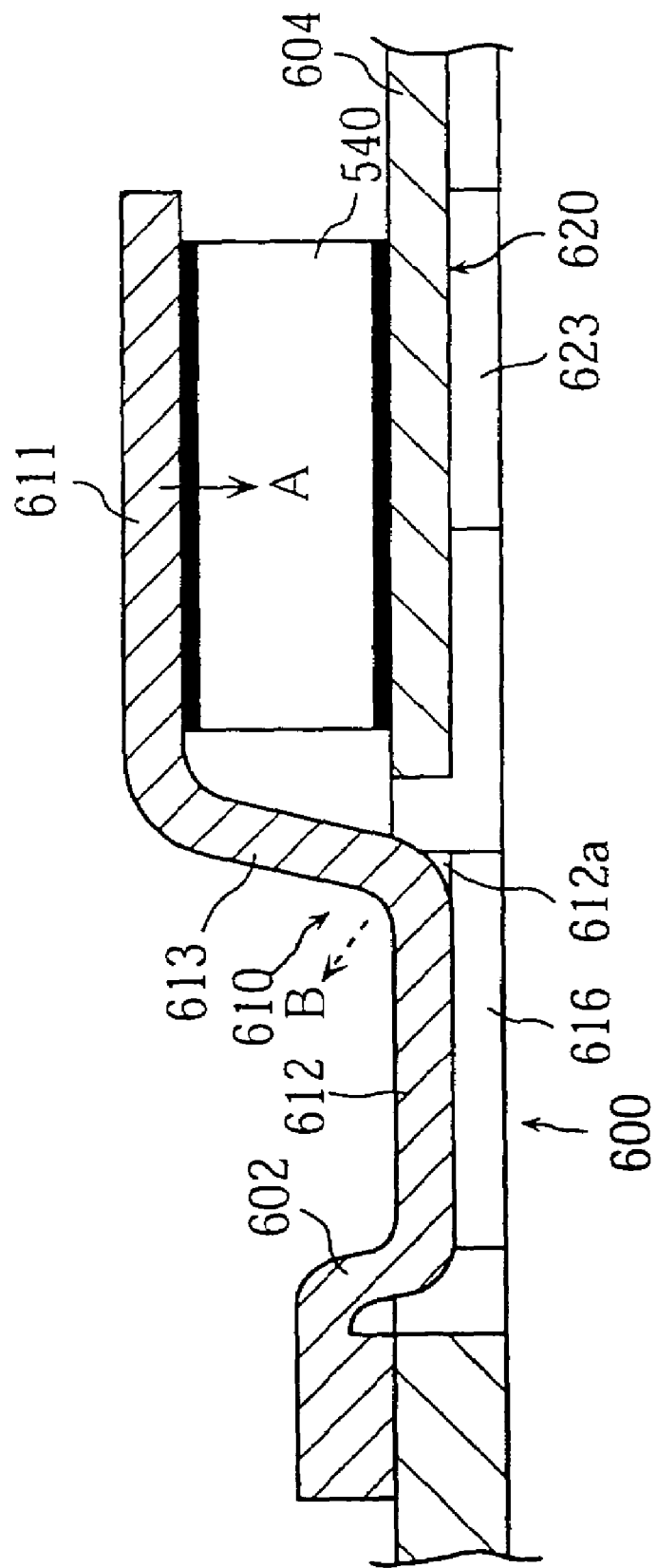
FIG. 31 is a sectional view taken in lines XXXI-XXXI in FIG. 30.

Next, as shown in FIG. 30 and FIG. 31, the first region 600a is pivoted around the supporting bars 601, onto the second region 600b. Specifically, the first portion 611 of each first conductor land 610 makes contact with the first surface 541 of the semiconductor chip 540 mounted on the corresponding second conductor land 620, when the first region 600a is overlapped on the second region 600b.

In the above step, appropriate contact must be established between the first portion 611 of the first conductor land 610 and the first surface 541. In order to achieve this, during the above-described forming step when the first conductor land 610 is bent, the first portion 611 and the second portion 612 are given certain appropriate angles with respect to the third portion 613 to exert a relatively large pressing force in a direction indicated by Arrow A in FIG. 31.

When the first portion 611 presses the semiconductor chip 540 in the direction A with a relatively large force, conventionally, the border region between the second portion 612 and the third portion 613 tends to be raised in a direction indicated by a broken-line Arrow B in FIG. 31. On the contrary, according to the lead frame 600, the width of the third portion 613 of the first conductor land 610 is smaller than the width of the first portion 611 and of the second portion 612, the third portion 613 is thinner than the second portion 612, and there are cutouts 612a provided at the border region between the second portion 612 and the third portion 613. Therefore, the border region between the second portion 612 and the third portion 613 has a relatively small stiffness, generating a smaller repelling force acting in the border region than before, thereby reducing unwanted lift of the border region. As a result, an appropriate positional relationship is maintained between the first portion 611 and the second portion 612.

Next, the electrically conductive material applied on the first portion 611 of the first conductor land 610 and on the second conductor land 620 is melted and then solidified for example, whereby the semiconductor chip 540 is bonded to the first portion 611 of the first conductor land 610, and to the second conductor land 620. Again, in this process, repelling force acting on the border region between the second portion 612 and the third portion 613 is smaller than in convention, reducing the tendency of the border region to be raised.

Next, all of the semiconductor chips 540 are sealed with e.g. an epoxy resin by means of a transfer-molding method, as shown in FIG. 32, in a resin packaging step. Specifically, a pair of metal mold halves (not illustrated) which provides a cavity when the halves are closed is used. The mold halves are closed, to accommodate the semiconductor chips 540, then the epoxy resin is injected into the cavity, and the resin is allowed to set to form the resin package 650.

According to the semiconductor device X5 offered by the present embodiment, the first terminal surface 516a and the second terminal surface 523a expose on the bottom surface 550a of the resin package 550. One of the mold half is contacted by the projections 616 in the second portion 612 of the first conductor land 610, and by the projections 623 of the second conductor land 620. With these, as described above, positional relationship between the first portion 611 of the first conductor land 610 and the second portion 612 is appropriately maintained. Therefore, the projections 616 contact appropriately on the mold. Therefore, it becomes possible to avoid unwanted invasion of the resin to between the mold and the projections 616 as well as to between the mold and the projections 623. As a result, the first terminal surface 616a and the second terminal surface 623a are reliably exposed, leading to increased yield in the manufacture of the semiconductor device.

Finally, as shown in FIG. 33, the bridge portions 601-605 which support the first conductor land 610 or the second conductor land 620 are cut with a diamond cutter DC for example. Through such a cutting, single-piece semiconductor devices X5 as shown in FIG. 23 through FIG. 25 are obtained.

Figure 34:
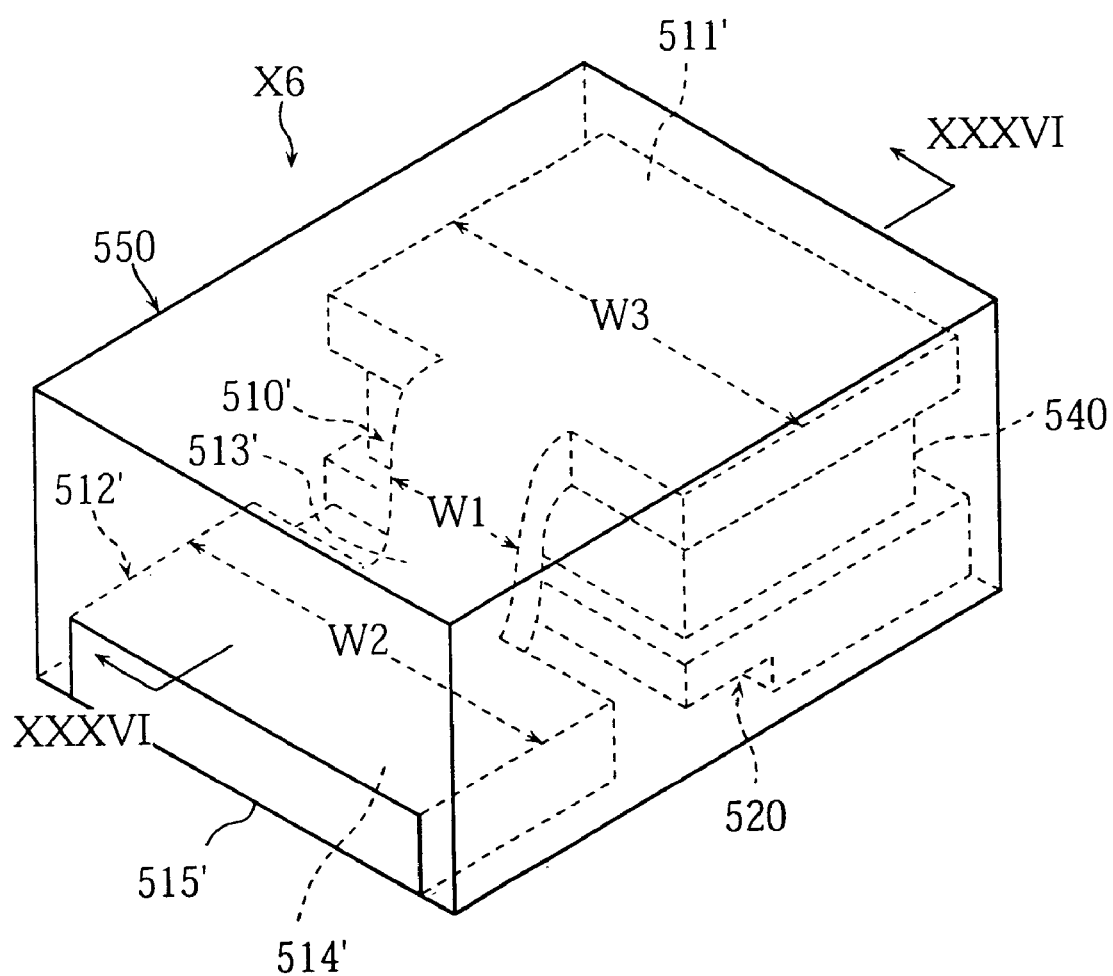
FIG. 34 is a perspective view of a semiconductor device according to a sixth embodiment of the present invention.
Figure 35:
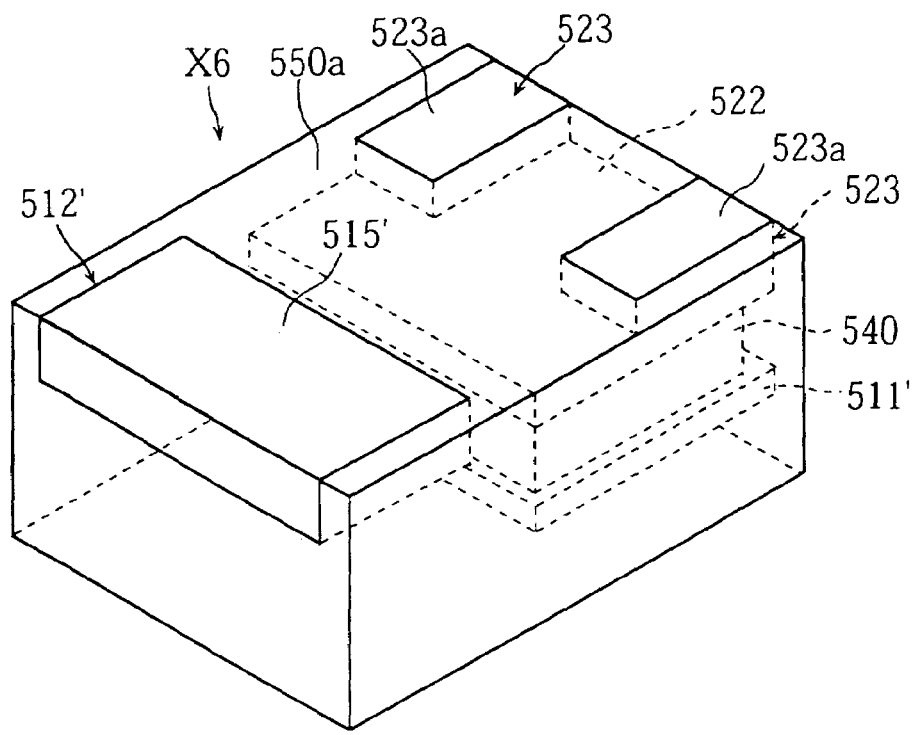
FIG. 35 is a perspective view of the semiconductor device in FIG. 34 viewed from the opposite side as in FIG. 34.
Figure 36:
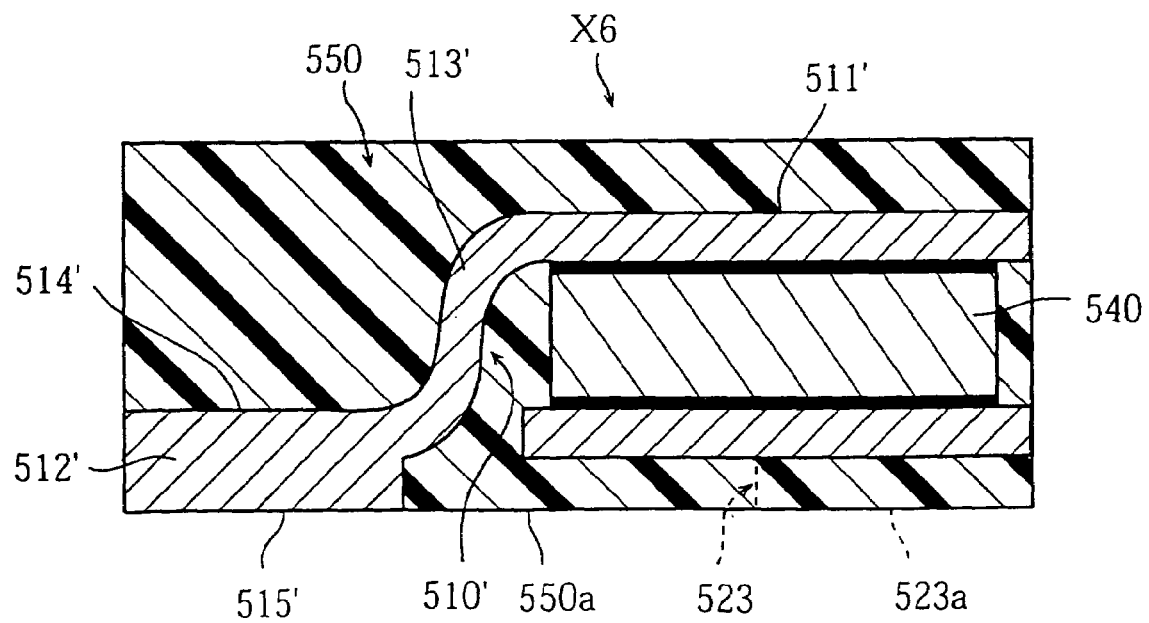
FIG. 36 is a fragmentary sectional view taken in lines XXXVI-XXXVI in FIG. 34.

FIG. 34 through FIG. 36 show a semiconductor device X6 according to a sixth embodiment of the present invention. FIG. 34 is a perspective view of the semiconductor device X6. FIG. 35 is a perspective view of the semiconductor device X6 viewed from the opposite side as in FIG. 34. FIG. 36 is a sectional view taken in lines XXXVI-XXXVI in FIG. 34.

The semiconductor device X6 differs from the semiconductor device X5 in the arrangement made to a first conductor 510'. The other arrangements in the semiconductor device X6 are the same as in the semiconductor device X5.

The first conductor 510' includes a first portion 511', a second portion 512' and a third portion 513'. The second portion 512' has a first surface 514' and a second surface away therefrom. The second surface exposes on a bottom surface 550a of a resin package 550, serving as a first terminal surface 515' of the semiconductor device X6. The third portion 513' is thinner than the second portion 512'. According to the present embodiment, the third portion 513' has the same thickness as the first portion 512'. However, according to the present invention, the third portion 513' may be thinner than the second portion 512'. The semiconductor device X6 is a three-terminal type that has one first terminal face 515' and two second terminal faces 523a.

Again in the semiconductor device X6, the third portion 513' has a width W1, which is smaller than a width W2 of the first portion 511' and a width W3 of the second portion 512'. Further, the third portion 513' is thinner than the second portion 512'. Thus, a border region between the second portion 512' and the third portion 513' has a small thickness. As a result, this portion has a reduced stiffness, so that when the semiconductor device X6 is manufactured through a process which is generally the same as described for the fifth embodiment, positional relationship between the first portion 511' and the second portion 512' is maintained appropriately, enabling to expose the first terminal surface 515' and the second terminal surfaces 523a properly on the bottom surface 550a of the resin package 550.

Figure 37:
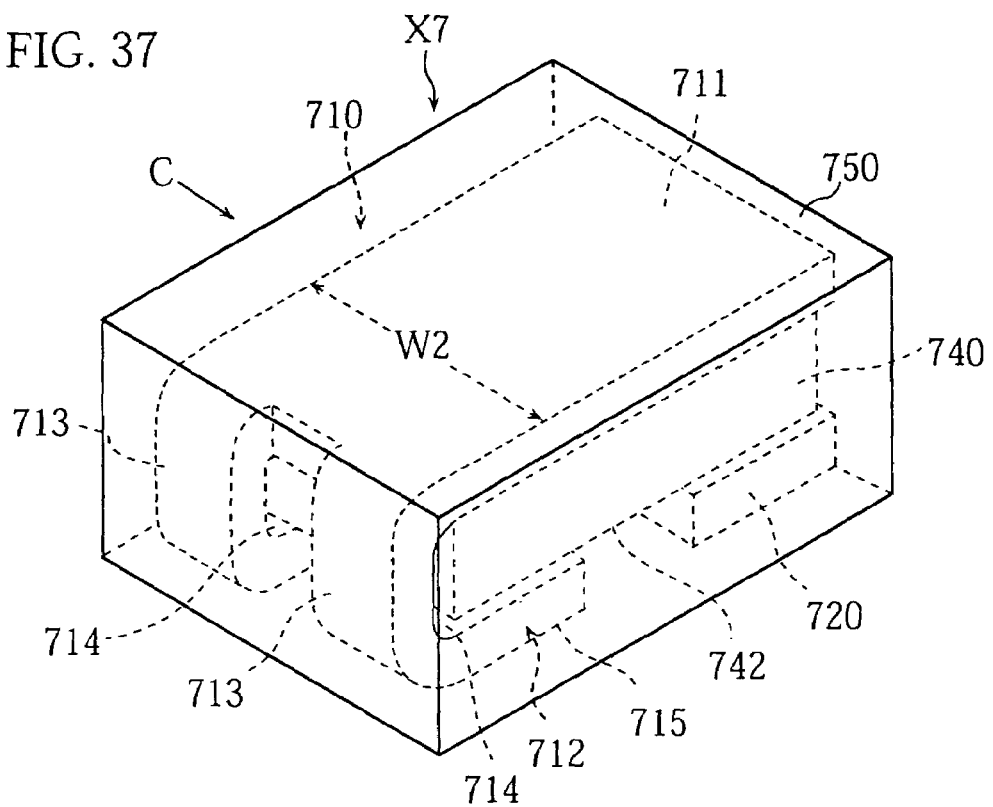
FIG. 37 is a perspective view of a semiconductor device according to a seventh embodiment of the present invention.
Figure 38:
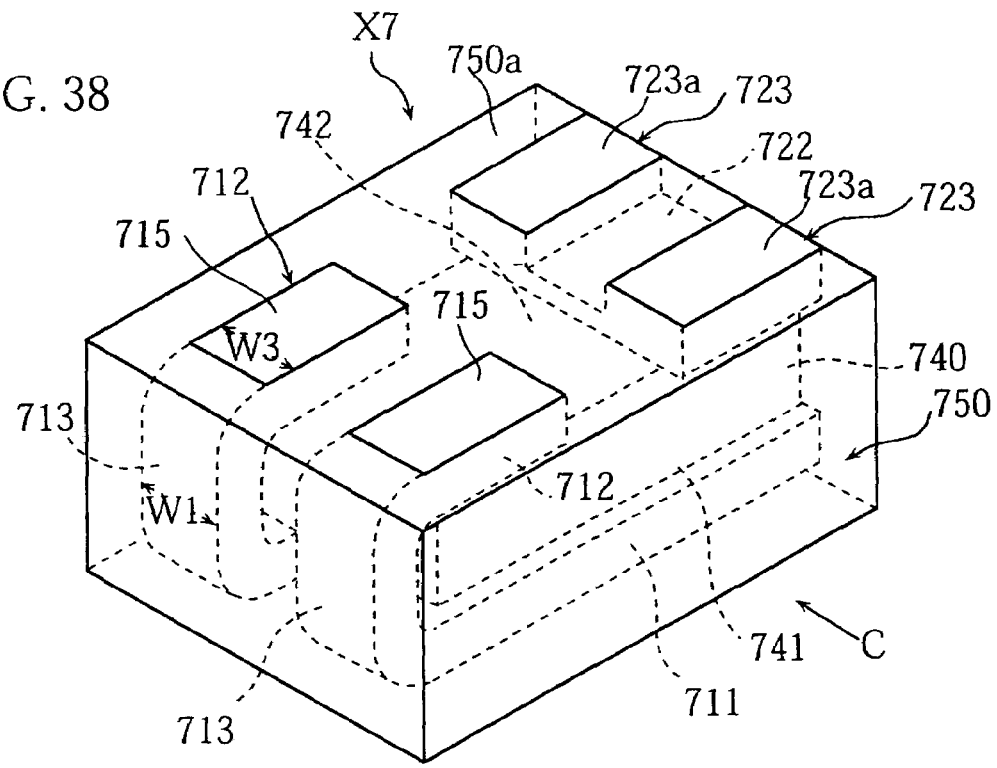
FIG. 38 is a perspective view of the semiconductor device in FIG. 37 viewed from the opposite side as in FIG. 37.
Figure 39:
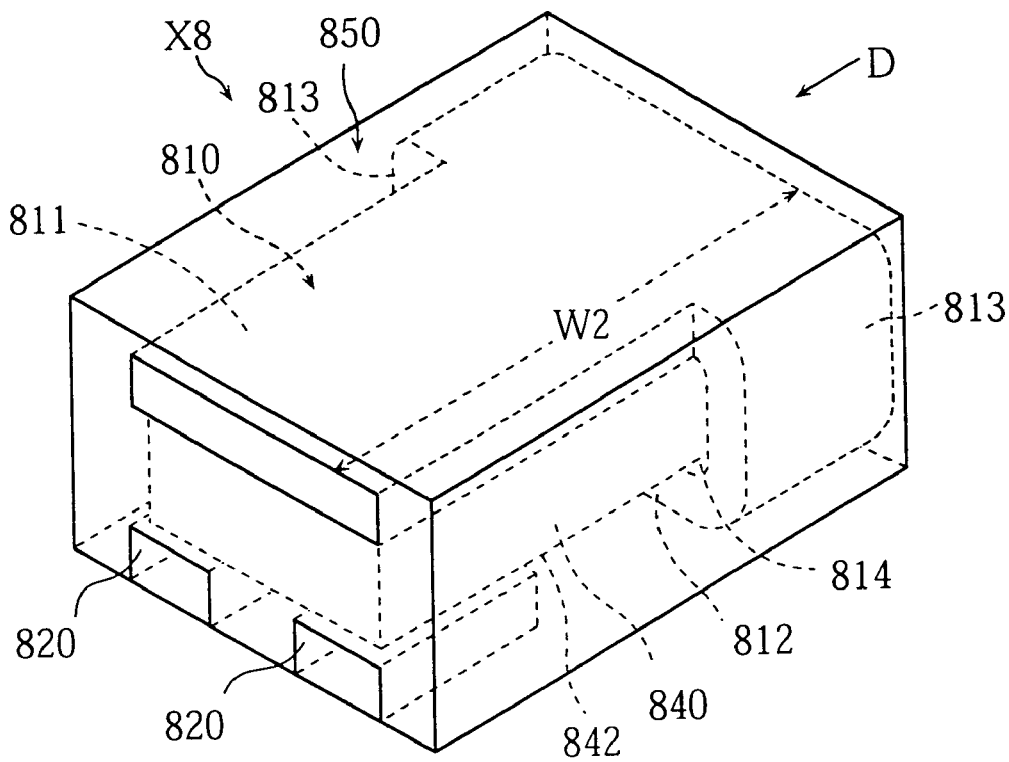
FIG. 39 is a perspective view of a semiconductor device according to an eighth embodiment of the present invention.

FIG. 37 through FIG. 39 show a semiconductor device X7 according to a seventh embodiment of the present invention. FIG. 37 is a perspective view of the semiconductor device X7. FIG. 38 is a perspective view of the semiconductor device X7 viewed from the opposite side as in FIG. 37.

The semiconductor device X7 includes a first conductor 710, a second conductor 720, a semiconductor chip 740 and a resin package 750.

The semiconductor chip 740 is a bear chip such as a diode, and has a first surface 741 and a second surface 742. The first surface 741 is provided with a first electrode (not illustrated) whereas the second surface 742 is provided with a second electrode (not illustrated).

The first conductor 710 includes a first portion 711, two second portions 712 and two third portions 713. The first portion 711 entirely covers the first surface 741, and connects to the first electrode. The two third portions 713 extend from the first portion 711, along a side surface of the semiconductor chip 740. Each of the third portions connects to the second portion 712. The second portion 712 is right beneath the semiconductor chip 740, has the first surface 714, and is bonded to the semiconductor chip 740 via this first surface 714. The second portion 712 has a second surface which is away from the first surface 714. This second surface exposes on a bottom surface 750a of the resin package 750, serving as a first terminal surface 715 for contact with an external terminal. The second portion 712 has a width W3, which is equal to a width W1 of the third portion 713. The width W1 is smaller than a width W2 of the first portion 711. For these reasons, the present embodiment also provides generally the same benefit as has been described for the fifth embodiment, such as increased yield in the manufacture of the semiconductor device.

The second portion 712 is bent in a direction away from the direction in which the second portion 512 of the first conductor 519 was bent in the fifth embodiment. Specifically, the second portion 712 is bent so as to come below the semiconductor chip 740. As a result, as clearly understood when viewed from a direction indicated by Arrow C in FIG. 37 and FIG. 38, the first conductor 710 has a shape of letter J. As understood, the semiconductor chip 740 is partially enclosed by the first conductor 710.

The second conductor 720 has a flat first surface 721 and a second surface 722 away therefrom. The second surface 722 is provided with a pair of projections 723. Each of the projections 723 has a second terminal surface 723a exposing on a bottom surface 750a of the resin package 750 for contact with an external terminal. The projections 723 are formed by means of half etching for example, performed to regions of the second surfaces 722 other than the regions to serve as the projections 723. The first conductor 710 and the second conductor 720 are spaced from each other by a predetermined distance, with the two first terminal surfaces 715 and the two second terminal surfaces 723a being on a same plane.

According to the semiconductor device X7, the first conductor 710 has a larger area than the first surface 741 of the semiconductor chip 740, and in addition, the semiconductor chip 740 is partially enclosed by the first conductor 710. Therefore, when the semiconductor device X7 is driven, heat generated in the semiconductor chip 740 is radiated efficiently from the first portion 711 of the first conductor 710 as well as the second portion 712, and particularly from the first portion 711. Therefore, the semiconductor device X7 has superior heat radiation.

Further, since the semiconductor chip 740 is partially enclosed by the first conductor 710, it is possible to make the size of semiconductor device X7 closer to the size of semiconductor chip 740, for further miniaturization of the semiconductor device X7. Specifically, for a given size of the semiconductor device X7, the semiconductor chip 740 of a greater size can be mounted, which means that the size limit to the mountable semiconductor chip 740 is reduced.

Figure 40:
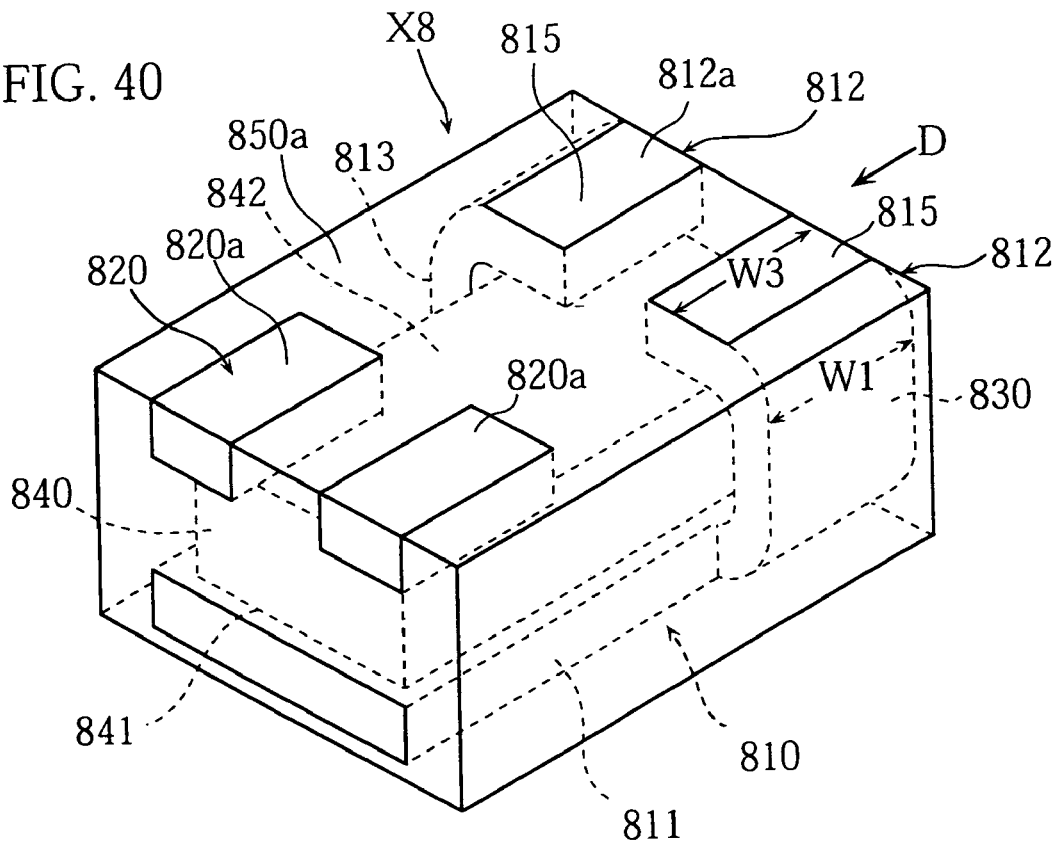
FIG. 40 is a perspective view of the semiconductor device in FIG. 39 viewed from the opposite side as in FIG. 39.

FIG. 39 through FIG. 40 show a semiconductor device X8 according to an eighth embodiment of the present invention. FIG. 39 is a perspective view of the semiconductor device X8. FIG. 40 is a perspective view of the semiconductor device X8 viewed from the opposite side as in FIG. 39.

The semiconductor device X8 includes a first conductor 810, two second conductors 820, a semiconductor chip 840 and a resin package 850.

The semiconductor chip 840 is a bear chip such as a diode, and has a first surface 841 and a second surface 842. The first surface 841 is provided with a first electrode (not illustrated) whereas the second surface 842 is provided with a second electrode (not illustrated).

The first conductor 810 includes a first portion 811, two second portions 812 and two third portions 813. The first portion 811 entirely covers the first surface 841 of the semiconductor chip 840, and connects to the first electrode. The two third portions 813 extend from the first portion 811, along a side surface of the semiconductor chip 840. Each of the third portions 813 leads to the second portion 812. The second portion 812 is right beneath the semiconductor chip 840, has a first surface 814, and is bonded to the semiconductor chip 840 via this first surface 814. The second portion 812 has a second surface which is away from the first surface 814. This second surface exposes on a bottom surface 850a of the resin package 850, serving as a first terminal surface 815 for contact with an external terminal. The second portion 812 has a width W3, which is equal to a width W1 of the third portion 813. The width W1 is smaller than a width W2 of the first portion 811. For these reasons, the present embodiment also provides generally the same benefit as has been described for the fifth embodiment, such as increased yield in the manufacture of the semiconductor device.

When viewed along Arrow D in FIG. 39 and FIG. 40, the first conductor 810 has a shape of letter C. As understood, the semiconductor chip 840 is partially enclosed by the first conductor 810. Therefore, the present embodiment also provides generally the same benefit of increased head radiation from the semiconductor device.

The second conductor 820 has a second terminal surface 820a which exposes on a bottom surface 850a of the resin package 850 for contact with an external terminal. The first conductor 810 and the second conductor 820 are spaced from each other by a predetermined distance, with the two first terminal surfaces 815 and the two second terminal surfaces 820a being on a same plane.

Figure 41:
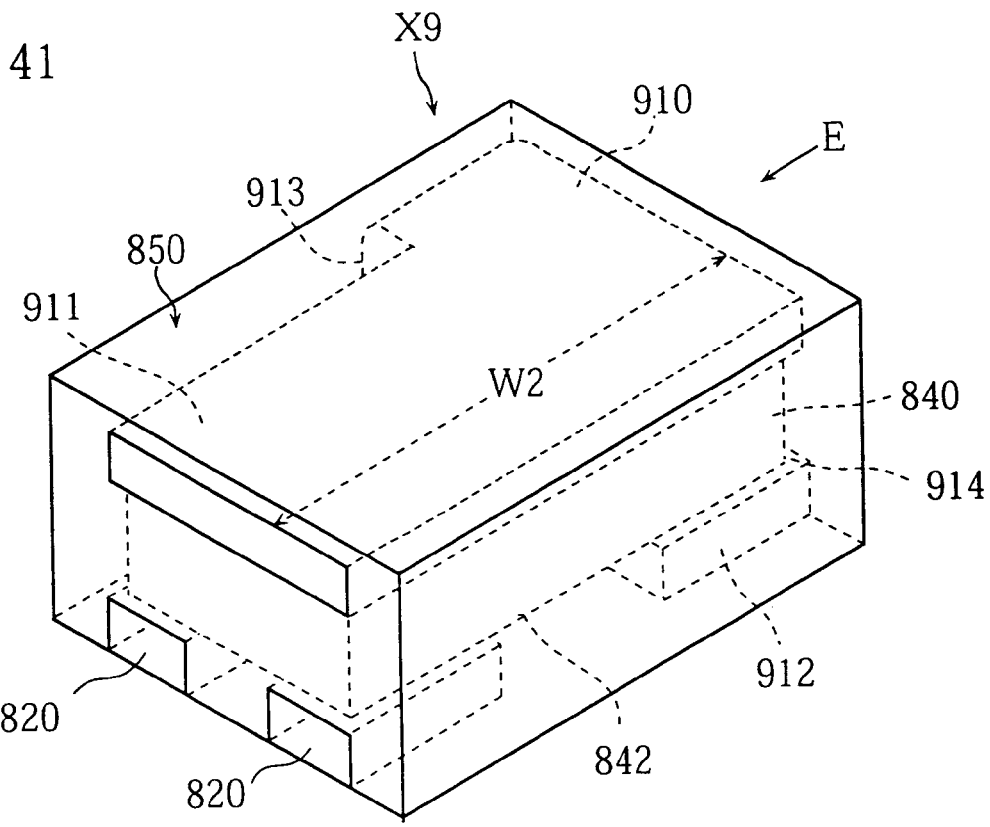
FIG. 41 is a perspective view of a semiconductor device according to a ninth embodiment of the present invention.
Figure 42:
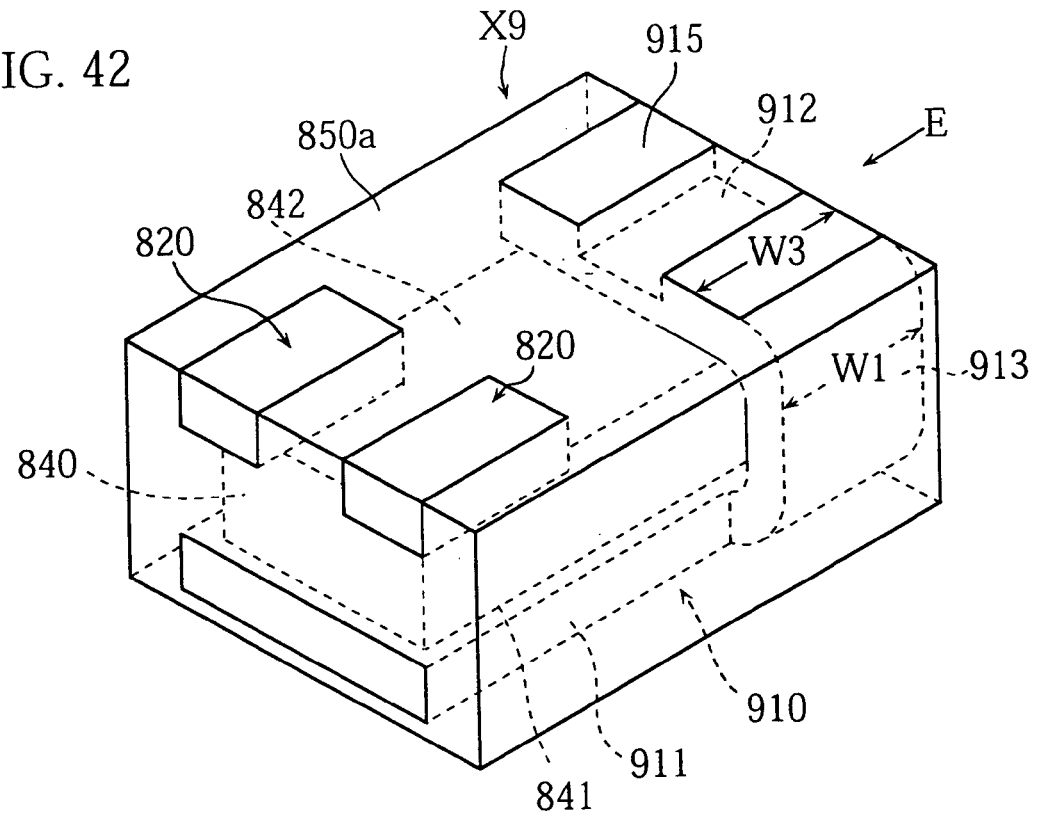
FIG. 42 is a perspective view of the semiconductor device in FIG. 41 viewed from the opposite side as in FIG. 41.

FIG. 41 and FIG. 42 show a semiconductor device X9 according to a ninth embodiment of the present invention. FIG. 41 is a perspective view of the semiconductor device X9. FIG. 42 is a perspective view of the semiconductor device X9 viewed from the opposite side as in FIG. 42.

The semiconductor device X9 differs from the eighth embodiment in the arrangement made for a first conductor 910. Other arrangements in the semiconductor device X9 are the same as in the eighth embodiment.

A first conductor 910 includes a first portion 911, a second portion 912 and a third portion 913. The first portion 910 entirely covers the first surface 841 of the semiconductor chip 840, and connects to the first electrode (not illustrated). A third portion 913 extends from the first portion 911, along a side surface of the semiconductor chip 940. The third portion 913 leads to the second portion 912. The second portion 912 is right beneath the semiconductor chip 840, has the first surface 914, and is bonded to the wire 940 via this first surface 914. The second portion 912 has a second surface away from the first surface 914. This second surface exposes on a bottom surface 850a of a resin package 850, serving as a first terminal surface 915 for contact with an external terminal. The second portion 912 has a width W3, which is equal to a width W1 of the third portion 913. The width W1 is smaller than a width W2 of the first portion 911. For these reasons, the present embodiment also provides generally the same benefit as has been described for the fifth embodiment, such as increased yield in the manufacture of the semiconductor device.

When viewed along Arrow E in FIG. 41 and FIG. 42, the first conductor 910 has a shape of letter U. As understood, the semiconductor chip 840 is partially enclosed by the first conductor 910. Therefore, the present embodiment also provides generally the same benefit of increased head radiation from the semiconductor device.

In any of the above-described embodiments, the number of the first conductors and the second conductors exposing on the bottom surface of resin package may be determined in accordance with the kind of semiconductor device.

The invention claimed is:

1. A method of making a semiconductor device, using a lead frame including a semiconductor device formation area formed with a first conductor land and a second conductor land, the first conductor land having a first terminal surface, the second conductor land being by the first conductor land and having a second terminal surface facing in a same direction as does the first terminal surface, the method comprising:

a step of placing a semiconductor chip including a first surface formed with a first electrode and a second surface facing away from the first surface and formed with a second electrode, on the first conductor land and the second conductor land, via the second surface;

a step of placing a third conductor so as to contact the first conductor land and the first surface of the semiconductor chip;

a step of electrically connecting between the first conductor land and the third conductor, between the second electrode of the semiconductor chip and the second conductor land, and between the first electrode of the semiconductor chip and the third conductor;

a step of sealing the first conductor, the second conductor, the third conductor and the semiconductor chip with a resin package while exposing the first terminal surface and the second terminal surface; and a step of cutting the first conductor land and the second conductor land from the lead frame.

2. A method of making a lead frame from a metal plate having a first surface, second surface facing away therefrom, and a thickness as between the first surface and the second surface, the lead frame including a first conductor land and a second conductor land opposed to each other at a space, the method comprising:

a step of performing a first etching to a first region in the first surface, to a middle of the thickness; and a step of performing a second etching to a second region in the second surface, to a middle of the thickness, the second region being displaced with respect to the first region;

wherein the first etching and the second etching form a gap between the first conductor land and the second conductor land, the first etching forming a first thin portion receding from the first surface, on the first conductor land at a region opposed by the second conductor land, and the second etching forming a second thin portion receding from the second surface, on the second conductor land at a region opposed by the first conductor land.

3. A method of making a semiconductor device, using a lead frame including a first region and a second region, the first region being formed with a first conductor land having a first portion, a second portion having a first terminal surface and a third portion connecting the first portion and the second portion, the second region being formed with a second conductor land having a second terminal surface, the method comprising:

a step of folding the first conductor land, at a first border region between the first portion and the third portion and at a second border region between the second portion and the third portion;

a step of placing a semiconductor chip on the first portion of the first conductor land, or on the second conductor land;

a step of overlapping the first region and the second region with each other, via the semiconductor chip;

a step of electrically connecting between the first portion of the first conductor land and the semiconductor chip and between the second conductor land and the semiconductor chip;

a step of sealing the first conductor, the second conductor and the semiconductor chip with a resin package while exposing the first terminal surface and the second terminal surface; and a step of cutting the first conductor land and the second conductor land, from the lead frame;

wherein the third portion is smaller than the first portion in width at the first border region, or the third portion is smaller than the second portion in width at the second border region.

4. The method according to claim 3, wherein the folding of the first conductor land in the step of folding the first conductor land leaves the second portion to extend from the third portion in a direction away from the first portion.

5. The method according to claim 3, wherein
the second portion includes a pair of projections each having the first terminal surface,
the third portion connecting to the second portion at a region between the pair of projections, the second border region being between the region sandwiched by the pair of projections and the third portion,
the width of the third portion at the second border region being smaller than a distance between the pair of projections.

6. The method according to claim 3, wherein
the second border region is formed with a pair of cutouts extending in an opposite direction from the extending direction of the third portion, at an interval corresponding to the width of the third portion,
the pair of cutouts being utilized for folding the third portion with respect to the second portion, in the step of folding the first conductor land.

7. The method according to claim 3, wherein the third portion is thinner than the first portion in the first border region.

8. The method according to claim 3, wherein the third portion is thinner than the second portion in the second border region.

* * * * *